(12) United States Patent
Kim et al.

(10) Patent No.: US 12,379,531 B2
(45) Date of Patent: Aug. 5, 2025

(54) DECORATION MEMBER AND DECORATION MEMBER MANUFACTURING METHOD

(71) Applicant: LG CHEM, LTD., Seoul (KR)

(72) Inventors: Yong Chan Kim, Daejeon (KR); Ki Hwan Kim, Daejeon (KR); Nansra Heo, Daejeon (KR); Jeong Woo Shon, Daejeon (KR); Jin Suk Song, Daejeon (KR); Pilsung Jo, Daejeon (KR)

(73) Assignee: LG CHEM, LTD., Seoul (KR)

( * ) Notice: Subject to any disclaimer, the term of this patent is extended or adjusted under 35 U.S.C. 154(b) by 943 days.

(21) Appl. No.: 17/054,870

(22) PCT Filed: Jun. 17, 2019

(86) PCT No.: PCT/KR2019/007275
§ 371 (c)(1),
(2) Date: Nov. 12, 2020

(87) PCT Pub. No.: WO2019/240558
PCT Pub. Date: Dec. 19, 2019

(65) Prior Publication Data
US 2021/0231850 A1 Jul. 29, 2021

(30) Foreign Application Priority Data

Jun. 15, 2018 (KR) .................. 10-2018-0069234

(51) Int. Cl.
*G02B 5/04* (2006.01)
*A45D 33/18* (2006.01)
(Continued)

(52) U.S. Cl.
CPC .............. *G02B 5/045* (2013.01); *B32B 15/20* (2013.01); *C03C 17/245* (2013.01);
(Continued)

(58) Field of Classification Search
CPC ........ A45D 33/18; A45D 34/00; A45D 40/00; A45D 2034/007; A45D 2040/0012;
(Continued)

(56) References Cited

U.S. PATENT DOCUMENTS 6,157,489 A 12/2000 Bradley, Jr. et al.
6,236,510 B1 5/2001 Bradley, Jr. et al.
(Continued)

FOREIGN PATENT DOCUMENTS

CN 1345274 A 4/2002
CN 1630587 A 6/2005
(Continued)

OTHER PUBLICATIONS

J. Schwiegerling, "Colorimetryt: CIELAB Color Space", excerpt from Field Guide to Visual and Ophthalmic Optics, SPIE Press, 2004 (Year: 2004).*
(Continued)

*Primary Examiner* — Stephone B Allen
*Assistant Examiner* — Adam W Booher
(74) *Attorney, Agent, or Firm* — BRYAN CAVE LEIGHTON PAISNER LLP

(57) ABSTRACT

The present specification relates to a decorative member comprising a base and inorganic layers comprising a first light absorption layer, a light reflection layer, and a second light absorption layer sequentially provided on the base, in which $\Delta E_{12}$ indicated in Equation 1 is 1 or more, and a method of manufacturing the decorative member.

14 Claims, 18 Drawing Sheets

(51) Int. Cl.
  *A45D 34/00* (2006.01)
  *A45D 40/00* (2006.01)
  *B29C 45/26* (2006.01)
  *B32B 15/082* (2006.01)
  *B32B 15/20* (2006.01)
  *C03C 17/245* (2006.01)
  *C08J 7/04* (2020.01)
  *C23C 14/00* (2006.01)
  *G02B 5/00* (2006.01)
  *G02B 5/26* (2006.01)
  *G02B 5/28* (2006.01)

(52) U.S. Cl.
  CPC ......... *C08J 7/0423* (2020.01); *C23C 14/0036* (2013.01); *G02B 5/003* (2013.01); *G02B 5/26* (2013.01); *G02B 5/285* (2013.01); *A45D 33/18* (2013.01); *A45D 34/00* (2013.01); *A45D 2034/007* (2013.01); *A45D 40/00* (2013.01); *A45D 2040/0012* (2013.01); *B29C 45/26* (2013.01); *B29K 2901/12* (2013.01); *B29K 2995/002* (2013.01); *B32B 15/082* (2013.01); *B32B 2307/4023* (2013.01); *B32B 2307/416* (2013.01); *B32B 2311/04* (2013.01); *B32B 2311/08* (2013.01); *B32B 2311/18* (2013.01); *B32B 2311/22* (2013.01); *B32B 2311/24* (2013.01); *B32B 2439/00* (2013.01); *C03C 2217/72* (2013.01); *C03C 2218/155* (2013.01); *C08J 2367/02* (2013.01)

(58) Field of Classification Search
  CPC ..... C08J 7/0423; C08J 2367/02; B29C 45/26; B32B 15/082; B32B 15/20; B32B 2307/4023; B32B 2307/416; B32B 2307/402; B32B 2311/04; B32B 2311/08; B32B 2311/18; B32B 2311/22; B32B 2311/24; B32B 2439/00; B32B 2451/00; C03C 17/245; C03C 2217/72; C03C 2218/155; C23C 14/0036; G02B 5/003; G02B 5/045; G02B 5/26; G02B 5/285; G02B 5/22; B29K 2901/12; B29K 2995/002
  See application file for complete search history.

(56) References Cited

U.S. PATENT DOCUMENTS

| | | | |
|---|---|---|---|
| 6,577,446 | B2 | 6/2003 | Kumazawa et al. |
| 6,602,578 | B1 | 8/2003 | Tompkin et al. |
| 6,686,042 | B1 | 2/2004 | LeGallee |
| 6,797,366 | B2 | 9/2004 | Hanson et al. |
| 8,184,259 | B2 | 5/2012 | Omote et al. |
| 8,287,994 | B2 | 10/2012 | Fukawa et al. |
| 9,678,258 | B2 | 6/2017 | Hankey et al. |
| 2004/0013805 | A1 | 1/2004 | Nagata et al. |
| 2005/0063067 | A1 | 3/2005 | Phillips et al. |
| 2005/0127663 | A1 | 6/2005 | Heim |
| 2008/0206495 | A1 | 8/2008 | Korechika et al. |
| 2011/0177300 | A1 | 7/2011 | Hankey et al. |
| 2011/0273356 | A1 | 11/2011 | Kawaguchi et al. |
| 2012/0300306 | A1 | 11/2012 | Nagahama et al. |
| 2013/0251947 | A1 | 9/2013 | Lazarev |
| 2015/0192897 | A1 | 7/2015 | Schilling et al. |
| 2015/0212244 | A1 | 7/2015 | Kim et al. |
| 2016/0052227 | A1* | 2/2016 | Takihara ............... B32B 27/06 428/141 |
| 2017/0052295 | A1* | 2/2017 | Sakuma ............... B32B 27/06 |
| 2017/0307795 | A1 | 10/2017 | Hankey et al. |
| 2017/0369709 | A1* | 12/2017 | Seydel ............... C09C 1/0036 |
| 2018/0033893 | A1 | 2/2018 | Lee et al. |
| 2018/0046017 | A1 | 2/2018 | Lee et al. |
| 2018/0267638 | A1 | 9/2018 | Yoon et al. |
| 2019/0161847 | A1 | 5/2019 | Ready et al. |
| 2019/0291504 | A1* | 9/2019 | Cho ............... G02B 5/0257 |
| 2019/0302317 | A1 | 10/2019 | Jones et al. |
| 2019/0358989 | A1* | 11/2019 | Locke ............... B42D 25/425 |
| 2019/0381761 | A1* | 12/2019 | Cho ............... B32B 33/00 |
| 2020/0062027 | A1* | 2/2020 | Shon ............... B44F 1/10 |
| 2020/0088917 | A1* | 3/2020 | Kim ............... B32B 27/36 |
| 2020/0114621 | A1* | 4/2020 | Kim ............... B32B 7/02 |
| 2020/0147924 | A1* | 5/2020 | Kim ............... B32B 3/30 |
| 2020/0319590 | A1* | 10/2020 | Lutz ............... G03H 1/0248 |
| 2021/0016540 | A1* | 1/2021 | Jo ............... B29C 45/26 |
| 2021/0022475 | A1* | 1/2021 | Kim ............... B44F 1/02 |
| 2021/0033755 | A1* | 2/2021 | Kim ............... G02B 5/003 |
| 2021/0053389 | A1* | 2/2021 | Jo ............... C08J 7/0423 |
| 2021/0061000 | A1* | 3/2021 | Song ............... B32B 3/00 |
| 2021/0124100 | A1* | 4/2021 | Kim ............... B32B 3/30 |
| 2021/0170718 | A1* | 6/2021 | Shon ............... B32B 3/30 |
| 2021/0186179 | A1* | 6/2021 | Kim ............... B65D 65/38 |
| 2021/0333451 | A1* | 10/2021 | Song ............... G02B 5/1842 |
| 2021/0347687 | A1* | 11/2021 | Jo ............... C23C 14/5873 |
| 2023/0161089 | A1* | 5/2023 | Jo ............... B44F 1/045 428/34.1 |

FOREIGN PATENT DOCUMENTS

| | | |
|---|---|---|
| CN | 101249773 A | 8/2008 |
| CN | 102725663 A | 10/2012 |
| CN | 202518003 U | 11/2012 |
| CN | 104245884 A | 12/2014 |
| CN | 104602909 A | 5/2015 |
| CN | 104903117 A | 9/2015 |
| CN | 107112075 A | 8/2017 |
| CN | 107521251 A | 12/2017 |
| CN | 111683562 A | 9/2020 |
| DE | 102016007649 A1 | 12/2017 |
| EP | 2420391 A2 | 2/2012 |
| EP | 2891554 A1 | 7/2015 |
| EP | 3725516 A1 | 10/2020 |
| GB | 1 234 079 A | 3/1971 |
| JP | H03-254943 A | 11/1991 |
| JP | 2001347798 A | 12/2001 |
| JP | 2002-530712 A | 9/2002 |
| JP | 2005516829 A | 6/2005 |
| JP | 2008143028 A | 6/2008 |
| JP | 2008-238599 A | 10/2008 |
| JP | 2008229997 A | 10/2008 |
| JP | 4304001 B2 | 7/2009 |
| JP | 2009168928 A | 7/2009 |
| JP | 2010-173273 A | 8/2010 |
| JP | 2010188713 A | 9/2010 |
| JP | 2011-005682 A | 1/2011 |
| JP | 2011173379 A | 9/2011 |
| JP | 2013515285 A | 5/2013 |
| JP | 2015-068849 A | 4/2015 |
| JP | 2016218913 A | 12/2016 |
| JP | 2017-205959 A | 11/2017 |
| KR | 10-0485287 B1 | 4/2005 |
| KR | 10-20100135837 A | 12/2010 |
| KR | 10-20120112690 A | 10/2012 |
| KR | 10-20140088328 A | 7/2014 |
| KR | 10-2016-0085132 A | 7/2016 |
| KR | 1020170133109 A | 12/2017 |
| TW | 201022673 A | 6/2010 |
| TW | 201600901 A | 1/2016 |
| WO | 0031571 A1 | 6/2000 |
| WO | 0043565 A1 | 7/2000 |
| WO | 0224818 A1 | 3/2002 |
| WO | 2009008403 A1 | 1/2009 |
| WO | 2016159602 A1 | 6/2016 |
| WO | 2016137282 A1 | 9/2016 |
| WO | 2017214007 A1 | 12/2017 |
| WO | 2018/030355 A1 | 2/2018 |

(56) References Cited

FOREIGN PATENT DOCUMENTS

| WO | 2018-164464 A1 | 9/2018 |
|----|----------------|--------|
| WO | 2019004722 A1  | 1/2019 |

OTHER PUBLICATIONS

CIE Draft Standard, Colorimetry—Part 4: CIE 1976 L*a*b* Colour Space, 2007 (Year: 2007).*

* cited by examiner

[FIG. 1]

| 400 |
|---|
| 300 |
| 200 |
| 100 |

[FIG. 2]

| 400 |
|---|
| 300 |
| 200 |
| 500 |
| 100 |

[FIG. 3]
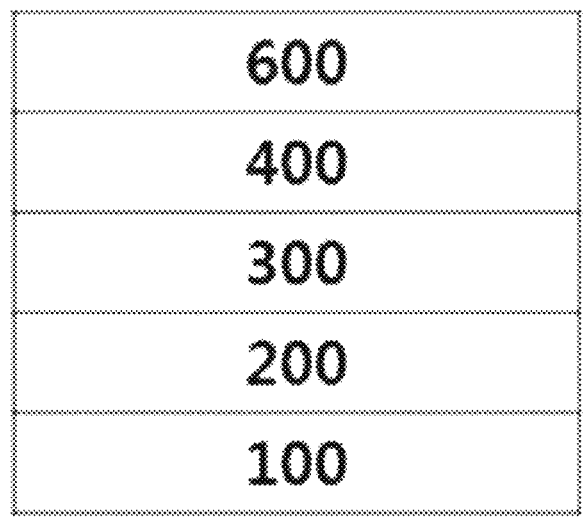

[FIG. 4]
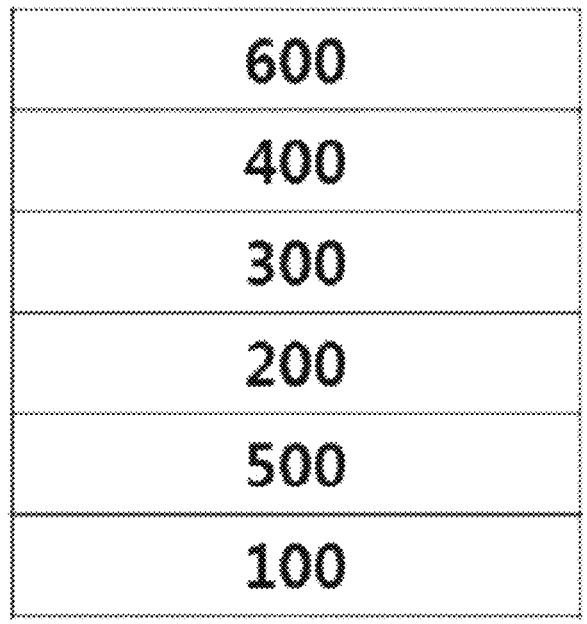
[FIG. 5]
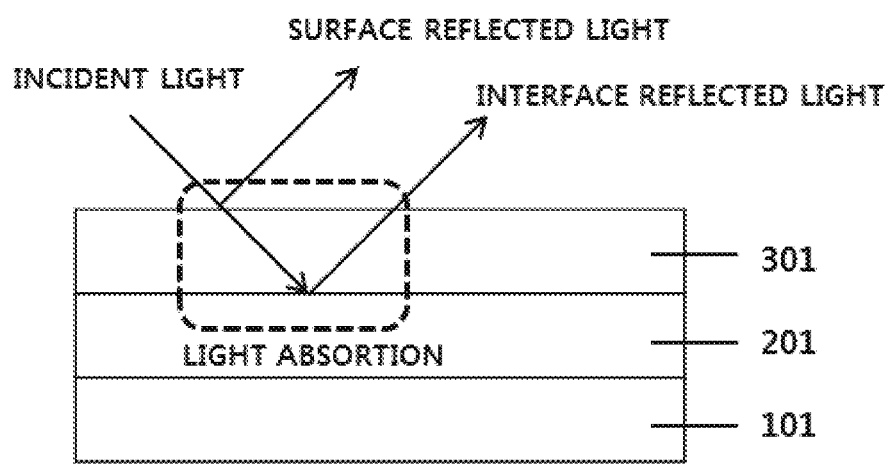
[FIG. 6]
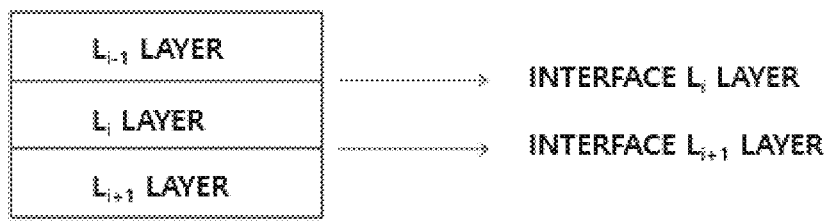

[FIG. 7]
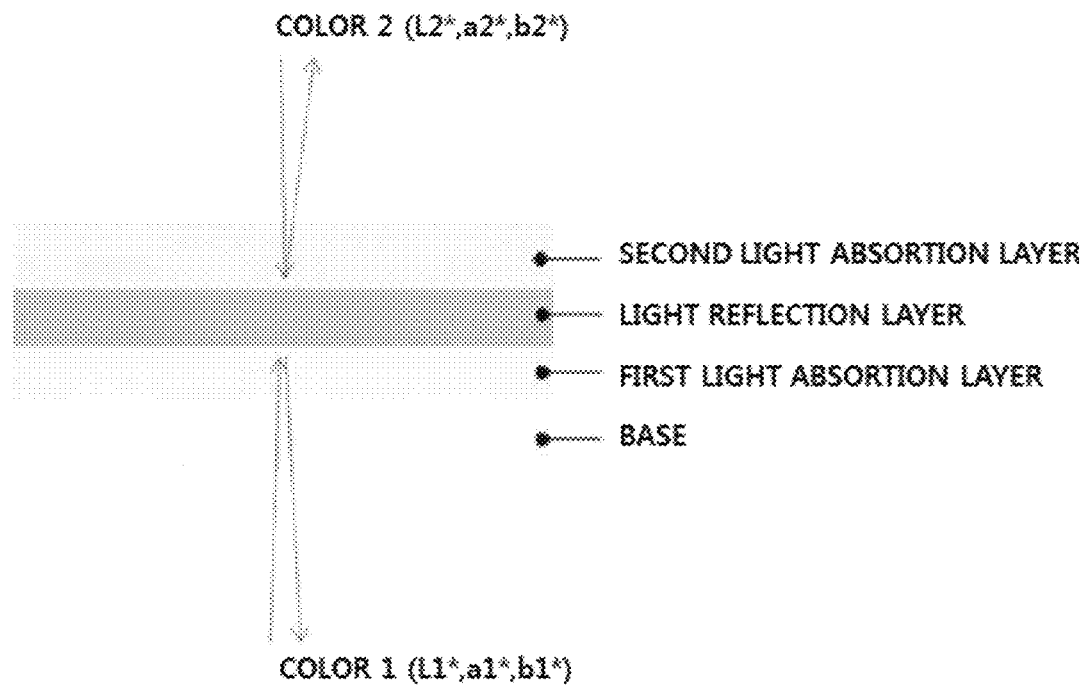
[FIG. 8]
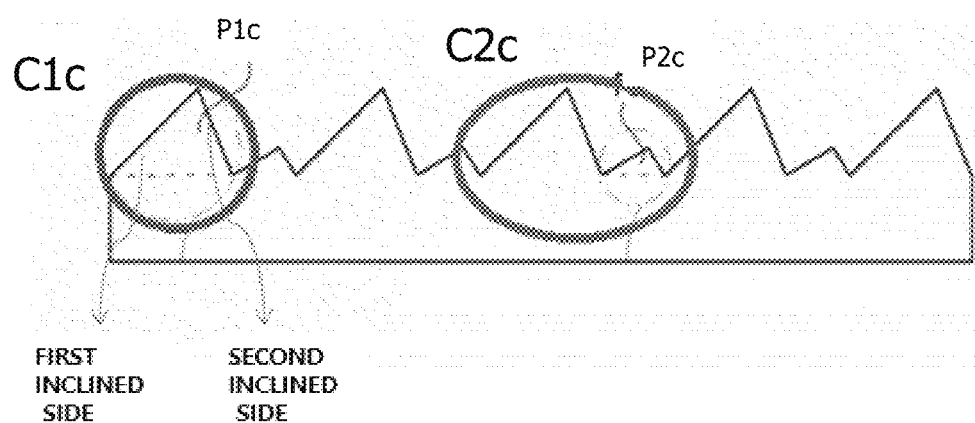

[FIG. 9]
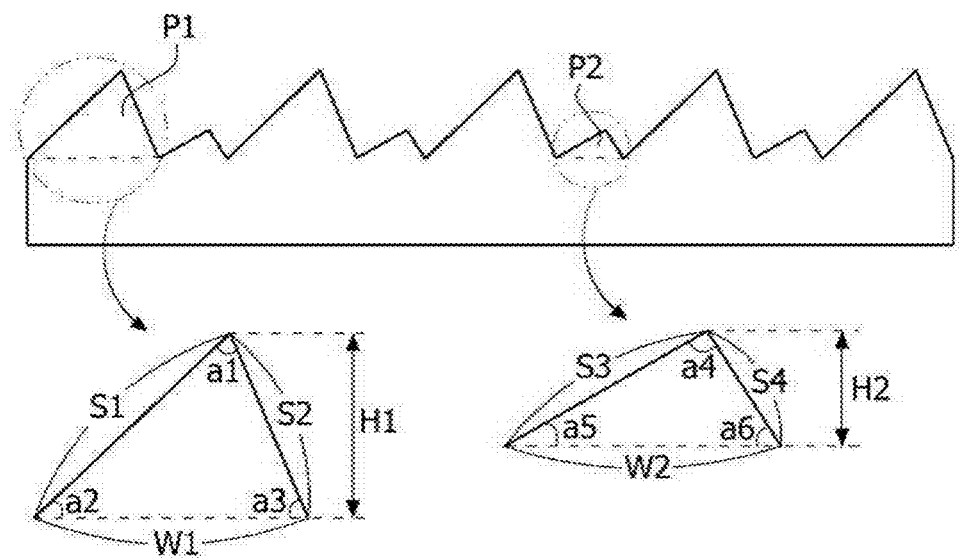
[FIG. 10]
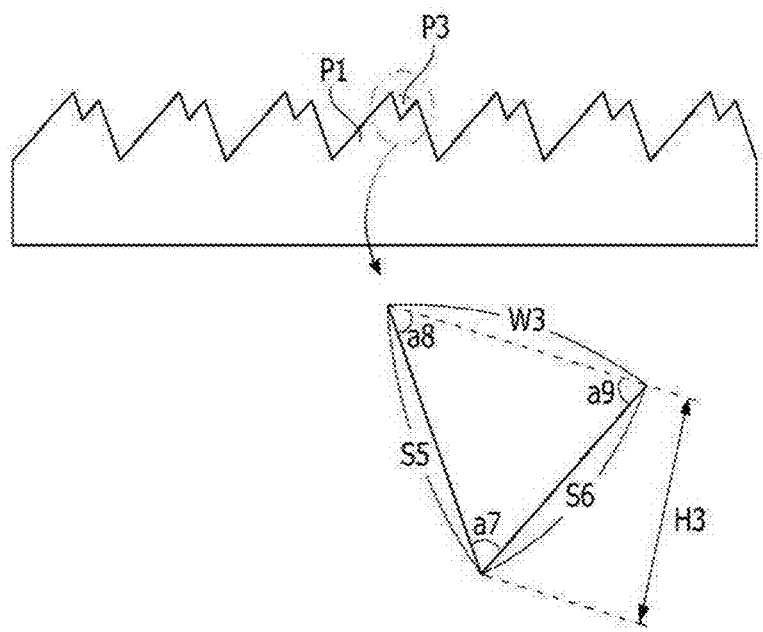

[FIG. 11]
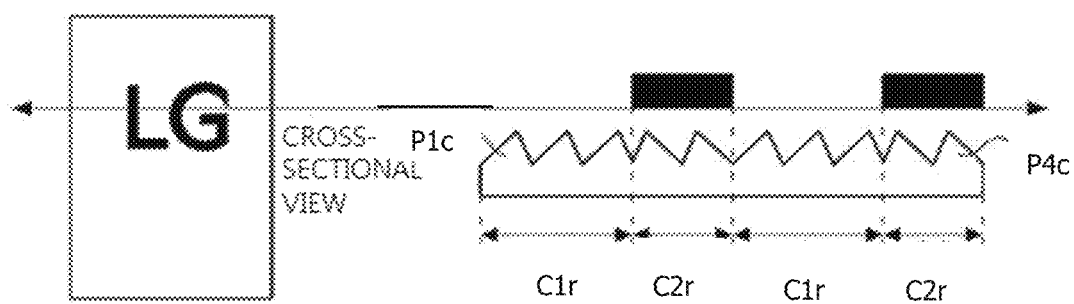
(a)
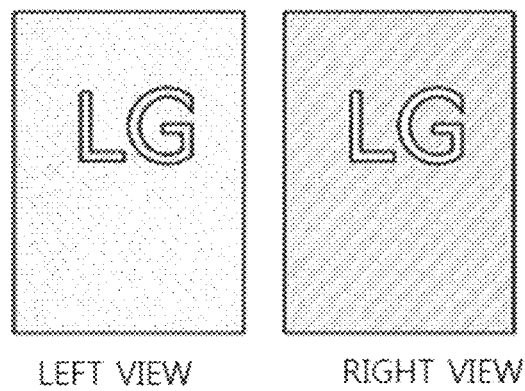
(b)

[FIG. 12]
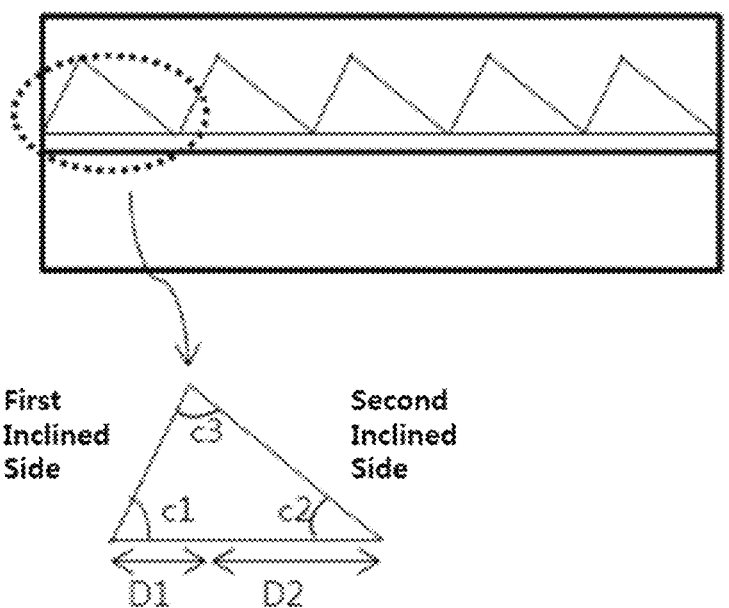
[FIG. 13]
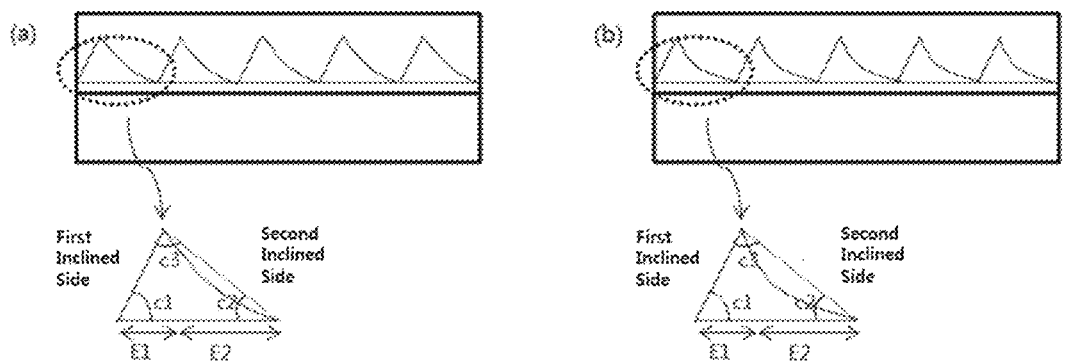

[FIG. 14]
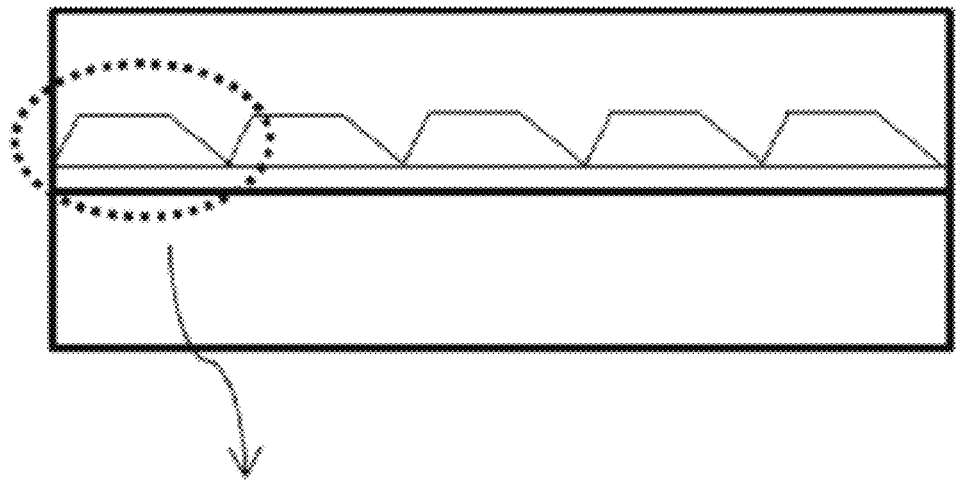
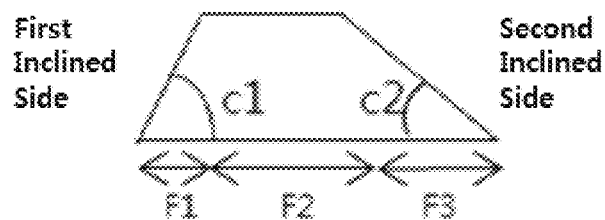
[FIG. 15]
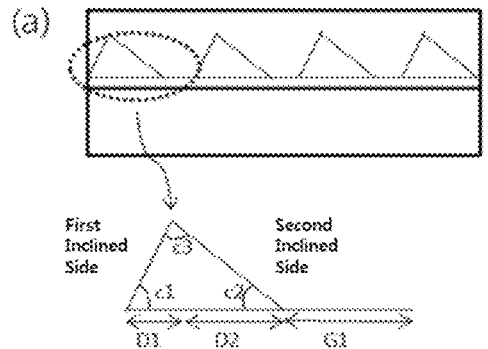 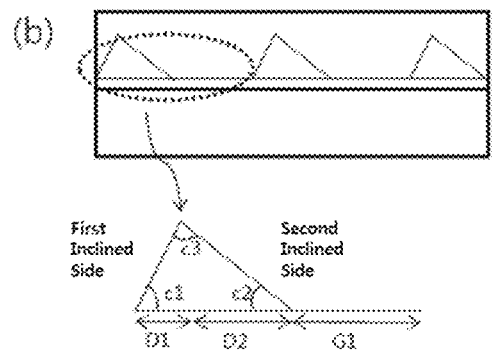

[FIG. 16]
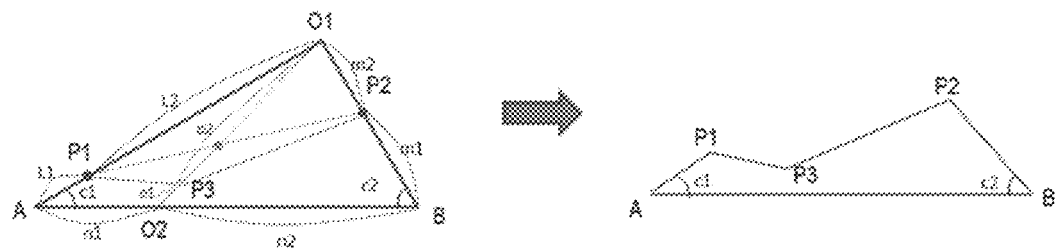

[FIG. 17]
[FIG. 18]
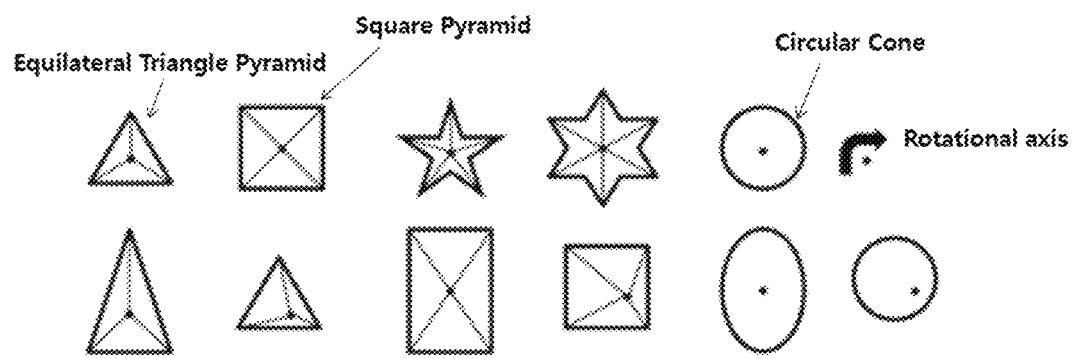
[FIG. 19]
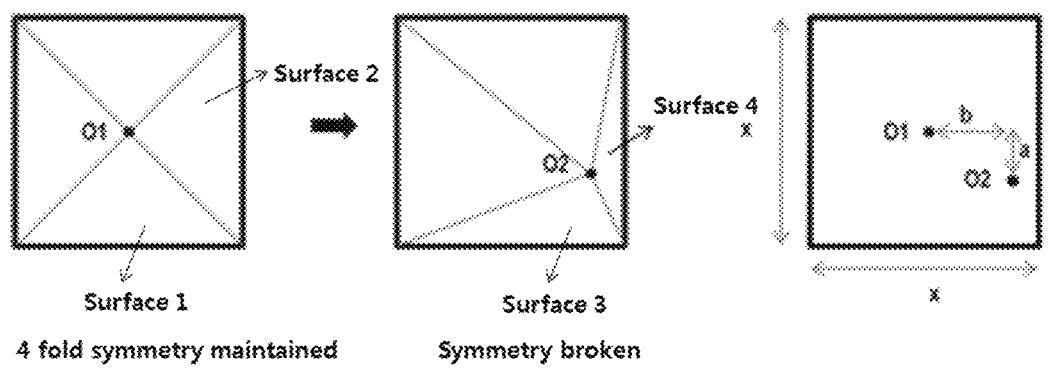

[FIG. 20]
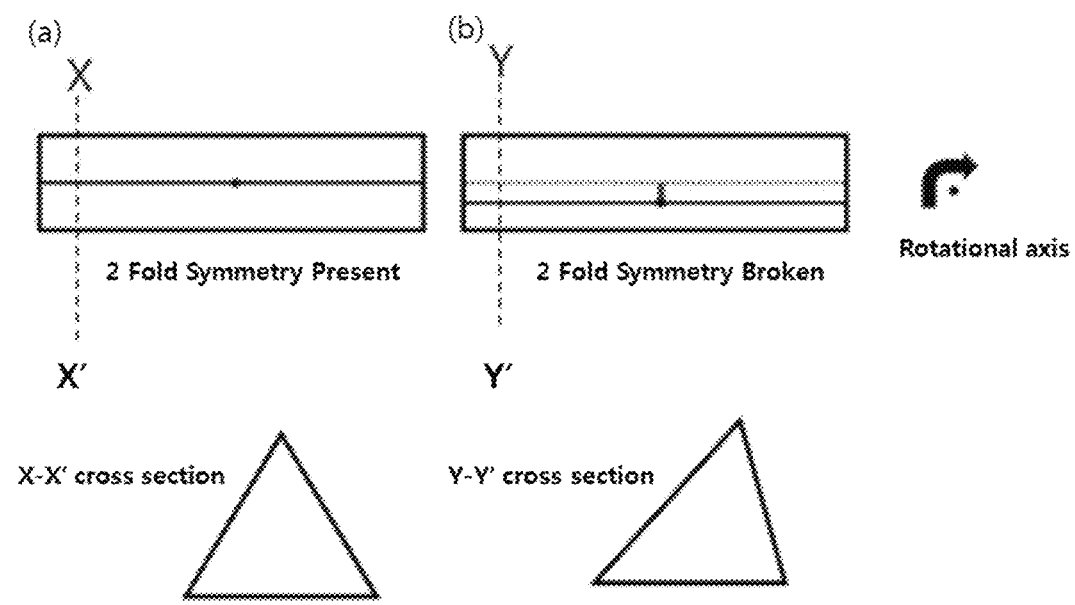
[FIG. 21]
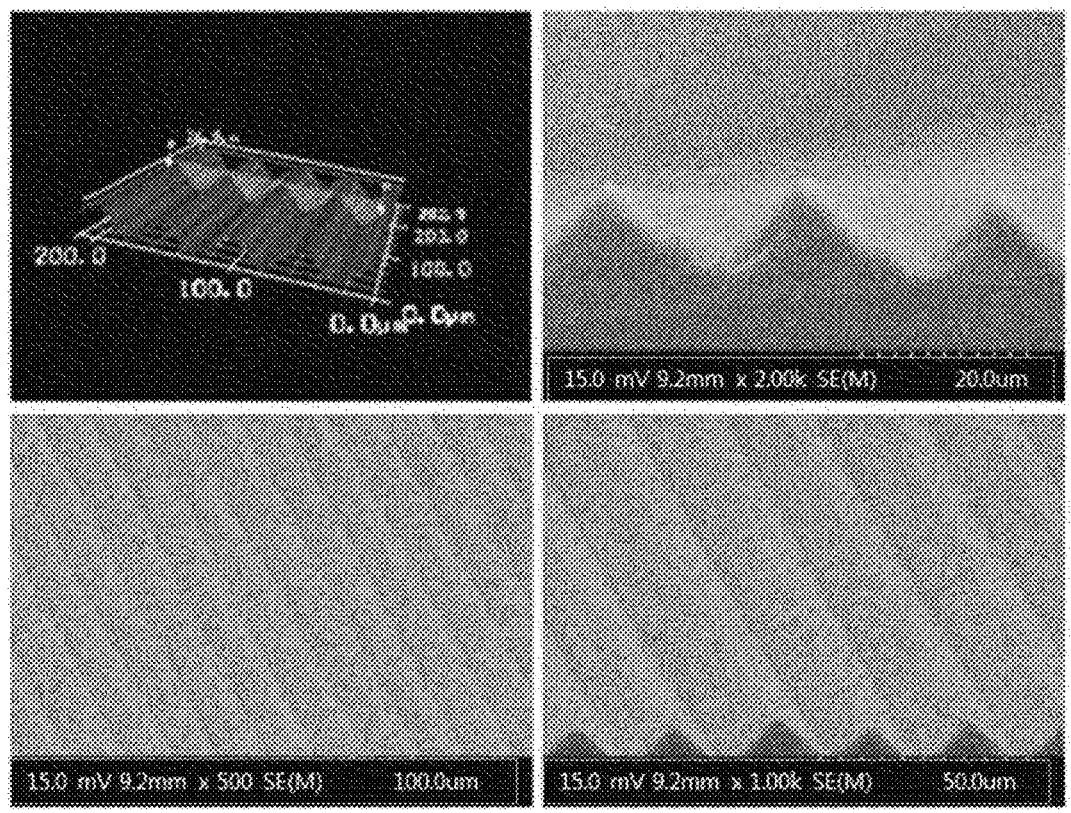

[FIG. 22]
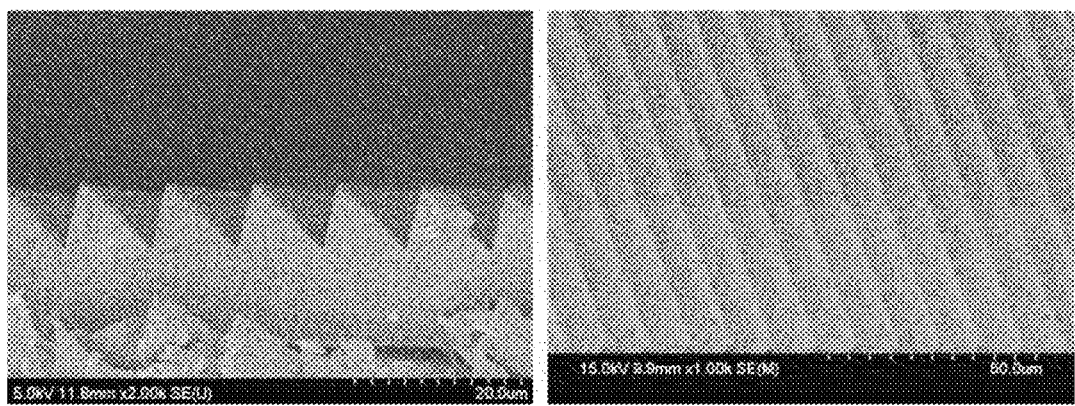

[FIG. 23]
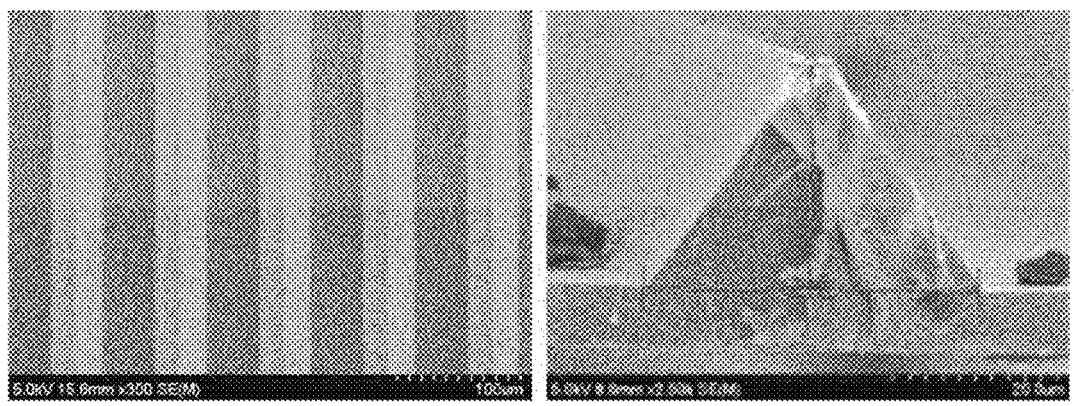
[FIG. 24]
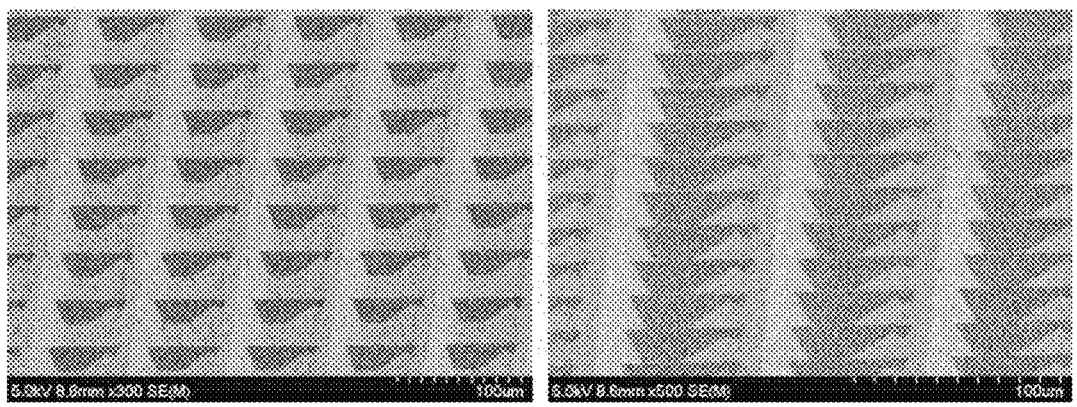

[FIG. 25]
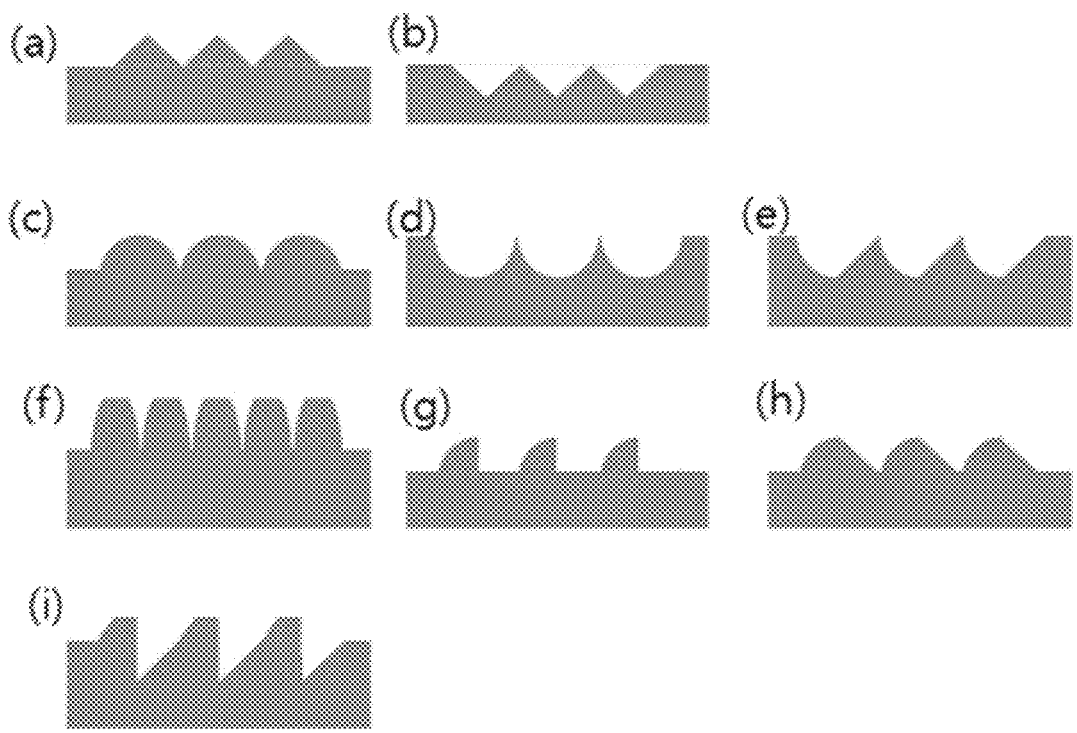

[FIG. 26]
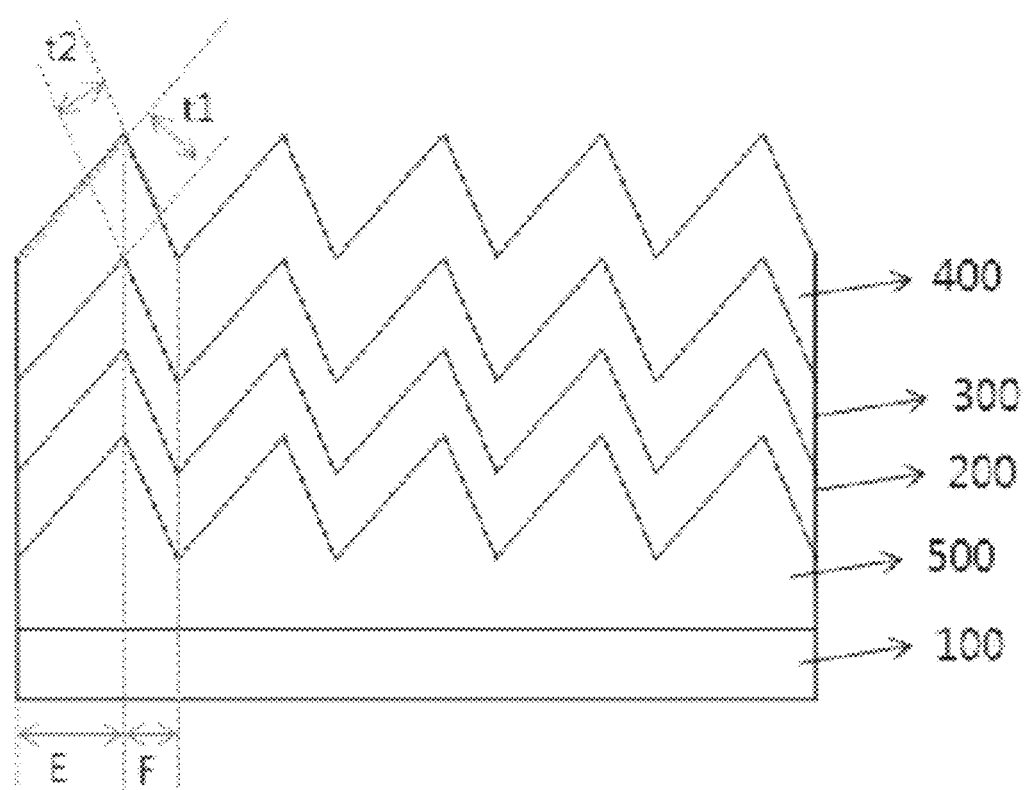

[FIG. 27]

[FIG. 28]

[FIG. 29]

| | FIRST LIGHT ABSORPTION LAYER | SECOND LIGHT ABSORPTION LAYER |
|---|---|---|
| | COLOR | COLOR |
| COMPARATIVE EXAMPLE 1 | 47,12,22 | 47,12,22 |
| EXAMPLE 1 | 48,13,23 | 22,4,4 |
| EXAMPLE 2 | 48,13,23 | 16,2,7 |
| EXAMPLE 3 | 48,13,23 | 28,1,-11 |

DECORATION MEMBER AND DECORATION MEMBER MANUFACTURING METHOD

The present application is a National Phase entry pursuant to 35 U.S.C. § 371 of International Application No. PCT/KR2019/007275 filed on Jun. 17, 2019 and claims priority to and the benefit of Korean Patent Application No. 10-2018-0069234 filed with the Korean Intellectual Property Office on Jun. 15, 2018, the entire contents of which are incorporated herein by reference.

FIELD

The present application relates to a decorative member and a method of manufacturing a decorative member.

BACKGROUND

For cosmetic containers, various mobile devices, and home appliances, in addition to functions of the products, design thereof, for example, colors, shapes, and patterns plays a big role in providing customers with high value. Preference for products and prices also depend on the design.

For example, in the case of a cosmetic compact container, various colors and color sensations are imparted in various ways and applied to the product. In order to provide the design, there are methods of providing a color to a casing material itself, and a method of attaching a decorative film having a color and a shape to a casing material.

In the case of the decorative film in the related art, the color is intended to be implemented by a method such as printing or vapor deposition. In order to impart different types of colors on a single surface, the printing needs to be performed two or more times, and it is practically difficult to variously impart the colors on a three-dimensional pattern. In addition, a decorative film in the related art is fixed in color depending on a viewing angle. Even though there is a slight change in color, the change in color is just limited to a difference in color sensations.

Patent Document

Korean Patent Application Laid-Open No. 10-2010-0135837

SUMMARY

The present application provides a decorative member and a method of manufacturing a decorative member.

The present specification provides a decorative member comprising a base; and inorganic layers comprising a first light absorption layer, a light reflection layer, and a second light absorption layer sequentially provided on the base, in which $\Delta E_{12}$ indicated in the following Equation 1 is 1 or more.

$$\Delta E_{12} = \sqrt{(L_1^* - L_2^*)^2 + (a_1^* - a_2^*)^2 + (b_1^* - b_2^*)^2} \quad \text{[Equation 1]}$$

In Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

In addition, the present specification provides a method of manufacturing the above-mentioned decorative member, the method comprising: preparing a base; and sequentially forming a first light absorption layer, a light reflection layer, and a second light absorption layer on the base, in which $\Delta E_{12}$ indicated in the following Equation 1 is 1 or more, $$\Delta E_{12} = \sqrt{(L_1^* - L_2^*)^2 + (a_1^* - a_2^*)^2 + (b_1^* - b_2^*)^2} \quad \text{[Equation 1]}$$

In Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

The present specification provides the decorative member having dichroism for imparting different colors depending on the viewing directions and having improved visibility of dichroism, and provides the method of manufacturing the decorative member.

In addition, the present specification provides the decorative member having different colors at both surfaces thereof and thus having dichroism depending on the viewing angle, and provides the method of manufacturing the decorative member.

In addition, the present specification provides the decorative member having dichroism for imparting different colors depending on the direction of viewing any one light absorbing layer of the decorative member and provides the method of manufacturing the decorative member.

BRIEF DESCRIPTION OF DRAWINGS

FIG. 1 is a view exemplarily illustrating a layered structure of a decorative member according to an exemplary embodiment.

FIG. 2 is a view exemplarily illustrating the layered structure of the decorative member according to the exemplary embodiment.

FIG. 3 is a view exemplarily illustrating a layered structure of the decorative member according to the exemplary embodiment.

FIG. 4 is views exemplarily illustrating another layered structure of the decorative members according to the exemplary embodiment of the present specification.

FIG. 5 is a view illustrating a laminate according to one aspect of the present specification.

FIG. 6 is a view illustrating a laminate structure formed according to a further aspect of the present specification.

FIG. 7 is a view illustrating a layered structure formed according to another aspect of the specification.

FIG. 8 is a view illustrating convex portions formed in a decorative member according to certain aspects of the specification.

FIG. 9 exemplarily illustrates the decorative member comprising the pattern layer according to the exemplary embodiment of the present specification.

FIG. 10 exemplarily illustrates the decorative member comprising the pattern layer according to the exemplary embodiment of the present specification.

FIG. 11A illustrates decorative member the pattern layer according to an exemplary embodiment of the present specification, and FIG. 11B illustrates a first and second Region of a deck remember us according to the exemplary embodiment.

FIG. 12 exemplarily illustrates the decorative member comprising the pattern layer according to the exemplary embodiment of the present specification.

FIG. 13A is a view illustrating a state in which the radius of curvature of a curved line is twice the width of a convex portion shape of a decorative member, and FIG. 13B is a view illustrating a state in which the radius of curvature of the curved line is one time the width of the convex portion shape.

FIG. 14 exemplarily illustrates a decorative member comprising a pattern layer according still another exemplary embodiment of the present specification.

FIGS. 15A and 15B exemplarily illustrate the decorative member comprising pattern layers according to different embodiments of the present specification.

FIG. 16 is a view exemplarily illustrating a pattern layer of a decorative member according to a further exemplary embodiment of the present specification, and a method of manufacturing the pattern layer.

FIGS. 17A and 17B are views exemplarily illustrating variations of the pattern layer manufactured by the method of manufacturing a pattern layer of the decorative member according to FIG. 16.

FIG. 18 is a view illustrating conical convex portions of a pattern layer when viewed from the surface of the convex portion.

FIG. 19 is a view illustrating conical convex portions of a pattern layer performed according to further aspects of the present specification.

FIG. 20A exemplarily illustrates a sectional view of a pattern having a convex portion having no imparted dichroism, and FIG. 20B exemplarily illustrates a section view of a pattern having a convex portion having imparted dichroism.

FIG. 21 illustrates convex and concave portions of a pattern layer of a decorative member according to one aspect of the present specification.

FIG. 22 illustrates convex and concave portions of a pattern layer of a decorative member according to another aspect of the present specification.

FIG. 23 illustrates convex and concave portions of a pattern layer of a decorative member according to a further aspect of the present specification.

FIG. 24 illustrates inverted trapezoidal concave portions having an asymmetric cross section perpendicular to the ground surface when the decorative member is placed on the ground surface is implemented.

FIGS. 25A-25I are sectional views of pattern layers formed according to various illustrative embodiments of the present specification.

FIG. 26 exemplarily illustrates a layered decorative member according to an exemplary embodiment of the present specification.

FIGS. 27A-27F illustrate layered decorative member constructions formed according to certain illustrative embodiments of the present specification.

FIGS. 28A-28F illustrate alternative layered decorative member constructions formed according to certain additional illustrative embodiments of the present specification.

FIG. 29 is a view illustrating colors of the decorative member according to Example 1.

DETAILED DESCRIPTION

Hereinafter, the present specification will be described in detail.

In the present specification, unless otherwise defined, the term "or" represents a case where listed components are selectively or all included, that is, means "and/or".

In the present specification, the term "layer" means that an area in which the corresponding layer exists is covered by 70% or more. The term "layer" means that the area is covered by, preferably, 75% or more, more preferably, 80% or more.

In the present specification, the term "cross section" means a section made by cutting a convex portion or a concave portion in any one direction. For example, the term "cross section" may mean a section made by cutting the convex portion or the concave portion in a direction parallel to the ground surface or a direction perpendicular to the ground surface when a decorative member is placed on the ground surface. On a surface of a convex portion shape or a concave portion shape of a pattern layer of a decorative member according to the exemplary embodiment, at least one of the cross sections formed in the direction perpendicular to the ground surface has an asymmetric structure.

In the present specification, the configuration in which "A, B, and C are sequentially provided" means a configuration in which A, B, and C are provided in this order, and other components may be included between A, B, and C. For example, the configuration in which "A, B, and C are sequentially provided" may comprise a configuration in which "D is further provided between A and B", that is, "A, D, B, and C are provided".

In the present specification, the term "a cross section having an asymmetric structure" means that a figure formed along a rim of a cross section has a structure that does not have line symmetry or point symmetry. Line symmetry refers to a property in which parts of any figure overlap each other when the figure is symmetric about a straight line. Point symmetry means a symmetric property in which when any figure is rotated about a point by 180 degrees, the figure completely overlaps an original figure. Here, a rim of the cross section having the asymmetric structure may have a straight shape, a curved shape, or a combination thereof.

In the present specification, the term "thickness of a certain layer" means a shortest distance from a lower surface to an upper surface of the layer.

Figures 1, 2:
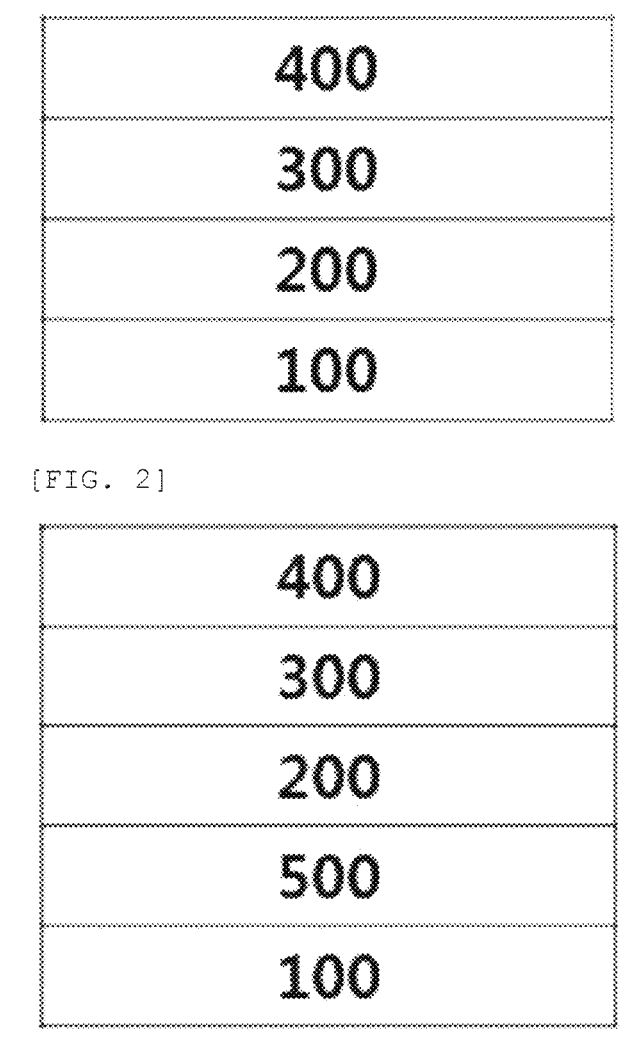

FIG. 1 is a view exemplarily illustrating a layered structure of a decorative member according to an exemplary embodiment of the present specification. FIG. 1 illustrates the layered structure of the decorative member in which a base 100, a first light absorption layer 200, a light reflection layer 300, and a second light absorption layer 400 are sequentially provided.

FIG. 2 is a view exemplarily illustrating the layered structure of the decorative member according to the exemplary embodiment of the present specification. The example in which a pattern layer 500 is provided between the base 100 and the first light absorption layer 200 is described as the layered structure of the decorative member. However, the pattern layer 500 may be provided between other components of the decorative member.

FIGS. 3 and 4 are views exemplarily illustrating the layered structures of the decorative members according to the exemplary embodiment of the present specification. A protective layer 600 is illustrated as being provided at the outermost periphery of the decorative member, but the protective layer 600 may be provided between other components.

In the present specification, the "light absorption layer" and the "light reflection layer" are layers having relative physical properties. The light absorption layer may refer to a layer having higher light absorbency than the light reflection layer, and the light reflection layer may refer to a layer having higher light reflectance than the light absorption layer.

Each of the light absorption layer and the light reflection layer may be configured to have a single-layered structure or a multilayer structure having two or more layers.

The light absorption layer absorbs light in a light incident route and a light reflection route. The light is reflected by a surface of the light absorption layer and by an interface between the light absorption layer and the light reflection layer, such that two reflected light beams constructively interfere or destructively interfere. This configuration is illustrated in FIG. 5. FIG. 5 is a view illustrating a laminate comprising a base 101, a light reflection layer 201, and a light absorption layer 301.

The light reflected by the surface of the light absorption layer may be expressed as surface reflective light, and the light reflected by the interface between the light absorption layer and the light reflection layer may be expressed as interface reflective light.

In the present specification, the light absorption layer and the light reflection layer are named depending on the functions thereof. A layer, which reflects a relatively large amount of light having a particular wavelength, may be expressed as the light reflection layer, and a layer, which reflects a relatively amount of light, may be expressed as the light absorption layer. This configuration may be described by means of the structure illustrated in FIG. 6 and the following Equations A and B.

$$\frac{[n_i(\lambda) \to n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \qquad \text{[Equation A]}$$

In the above Equation, $n_i(\lambda)$ represents a refractive index based on a wavelength $\lambda$ of an $i^{th}$ layer, and $k_i(\lambda)$ represents an extinction coefficient based on the wavelength $\lambda$ of the $i^{th}$ layer. The extinction coefficient is a criterion used to define how intensely a target material may absorb light having a particular wavelength, and the definition of the extinction coefficient will be described below.

Assuming that a sum of reflectance for respective wavelengths at the interface $I_i$ calculated in respect to respective wavelengths by applying the above Equation is $R_i$, $R_i$ is calculated by means of the following Equation B.

$$R_i = \frac{\sum_{\lambda=380\ nm}^{\lambda=780\ nm} \frac{[n_i(\lambda) \to n_{i-1}(\lambda)]^2 + [k_i(\lambda) - k_{i-1}(\lambda)]^2}{[n_i(\lambda) + n_{i-1}(\lambda)]^2 + [k_i(\lambda) + k_{i-1}(\lambda)]^2} \Delta\lambda}{\sum_{\lambda=380\ nm}^{\lambda=780\ nm} \Delta\lambda}$$

In this case, assuming that $R_i$ is highest at the interface $I_i$ of the laminate, a layer, which adjoins the interface $I_i$ and is positioned to face the interface $I_i$ in a direction in which the light enters, may be defined as the light reflection layer, and the remaining layer may be defined as the light absorption layer. For example, in the laminate illustrated in FIG. 6, assuming that the sum of the reflectance for respective wavelengths at the interface $I_{i+1}$ is highest, a layer ($L_{i+1}$ layer), which adjoins $I_{i+1}$ and is positioned to face the interface $I_{i+1}$ in the direction in which the light enters, may be defined as the light reflection layer, and the remaining layers ($L_{i-1}$ layer and $L_i$ layer) may be defined as the light absorption layers.

The decorative member according to the exemplary embodiment of the present specification comprises the base; and inorganic layers comprising the first light absorption layer, the light reflection layer, and the second light absorption layer sequentially provided on the base, and $\Delta E_{12}$ indicated in the following Equation 1 is 1 or more.

$$\Delta E_{12} = \sqrt{(L_1^* - L_2^*)^2 + (a_1^* - a_2^*)^2 + (b_1^* - b_2^*)^2} \qquad \text{[Equation 1]}$$

In Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

The decorative member according to the exemplary embodiment of the present specification comprises the base. The base will be described below.

The decorative member according to the exemplary embodiment of the present specification comprises the inorganic layers comprising the first light absorption layer, the light reflection layer, and the second light absorption layer sequentially provided on the base. The light absorption layer may be generally described except for the description of the configuration in which the first light absorption layer and the second light absorption layer are provided with the light reflection layer interposed therebetween.

The decorative member according to the exemplary embodiment of the present specification has a structure in which the first light absorption layer, the light reflection layer, and the second light absorption layer are sequentially disposed. This structure may be called a sandwich structure. The light incident on each of the light absorption layers is reflected by the light reflection layer and then enters a person's eyes or an observation means through the light absorption layer.

According to the exemplary embodiment of the present specification, a color 1 of the light, which is incident on the first light absorption layer and reflected by one surface of the light reflection layer adjacent to the first light absorption layer, may be different from a color 2 of the light which is incident on the second light absorption layer and reflected by one surface of the light reflection layer adjacent to the second light absorption layer. This configuration may be described from the layered structure illustrated in FIG. 7.

In this case, a size of a formed image may be adjusted by changing a surface structure of the light reflection layer to a convex or concave shape.

In the exemplary embodiment of the present specification, the difference between the color 1 and the color 2 may be expressed by the following Equation 1.

In the case of the decorative member according to the exemplary embodiment of the present specification, $\Delta E_{12}$ indicated in the following Equation 1 may be 1 or more, 3 or more, 10 or more, 20 or more, or 30 or more.

$$\Delta E_{12} = \sqrt{(L_1^* - L_2^*)^2 + (a_1^* - a_2^*)^2 + (b_1^* - b_2^*)^2} \qquad \text{[Equation 1]}$$

In Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

$\Delta E_{12}$ means the difference between the color 1 formed by the first light absorption layer of the decorative member and the color 2 formed by the second light absorption layer and differs from $\Delta E$ that means a color difference imparted depending on a viewing angle of any one of the light absorption layers.

In addition, $\Delta E_{12}$ may be measured at the same center viewing angle of the light absorption layers. The center viewing angle may be an angle between a normal line to the surface of the light absorption layer and a straight line that connects the observation means and a center point of the surface of the light absorption layer of the decorative member. For example, $\Delta E_{12}$ may be a value measured at each of the light absorption layers at a point at which the center viewing angle is 0 degree. The point at which the center viewing angle is 0 degree may be a value measured on the straight line on the first light absorption layer or the second light absorption layer when the straight line is a straight line in a direction of a normal line to the light absorption layer of the decorative member.

The configuration in which $\Delta E_{12}$ has any positive value instead of 0 means that the color imparted by the first light absorption layer and the color imparted by the second light absorption layer are different from each other. In this case, the colors sensed by an observer are different when a direction in which the decorative member is observed is the direction toward the first light absorption layer, and when the direction in which the decorative member is observed is the direction toward the second light absorption layer. Therefore, various types of color sensations may be provided to the observer depending on the direction of viewing the decorative member.

Specifically, when $\Delta E_{12}$ satisfies the numerical value range, more various colors may be imparted by the first light absorption layer and the second light absorption layer, thereby providing more various types of color sensations to the observer depending on the direction of viewing the decorative member.

In the exemplary embodiment of the present specification, $L_1^*:L_2^*$ may be 1.1:1 to 5:1, preferably 1.1 to 4.5:1, more preferably, 1.1:1 to 4:1.

In the exemplary embodiment of the present specification, $(a_1^*)^2+(b_1^*)^2:(a_2^*)^2+(b_2^*)^2$ may be 2:1 to 200:1, preferably, 2:1 to 150:1, more preferably, 2:1 to 100:1. When the numerical value range is satisfied, various types of chromaticity of colors may be imparted by the first light absorption layer and the second light absorption layer.

In the exemplary embodiment of the present specification, CIE lightness ($L_1^*$) of the first light absorption layer may be 0 or more and 100 or less, $(a_1^*)^2+(b_1^*)^2$ may be 300 or more and 28,000 or less.

In the exemplary embodiment of the present specification, the CIE lightness ($L_1^*$) of the first light absorption layer may be 0 or more and 100 or less, preferably, 0 or more and 95 or less, and $(a_1^*)^2+(b_1^*)^2$ may be 300 or more and 28,000 or less, preferably, 350 or more and 25,000 or less.

In the exemplary embodiment of the present specification, the CIE lightness ($L_2^*$) of the second light absorption layer may be 0 or more and 100 or less, and $(a_2^*)^2+(b_2^*)^2$ may be 10 or more and 28,000 or less.

In the exemplary embodiment of the present specification, the CIE lightness ($L_2^*$) of the second light absorption layer may be 0 or more and 100 or less, or 0 or more and 95 or less, and $(a_2^*)^2+(b_2^*)^2$ may be 10 or more and 28,000 or less, or 20 or more and 25,000 or less.

In the exemplary embodiment of the present specification, a difference value between $(a_1^*)^2+(b_1^*)^2$ and $(a_2^*)^2+(b_2^*)^2$ may be 10 or more and 25,000 or less, 20 or more and 23,000 or less, 50 or more and 20,000 or less, or 100 or more and 20,000 or less. When the numerical value range is satisfied, more various types of lightness and chromaticity of colors may be imparted by the first light absorption layer and the second light absorption layer.

In the exemplary embodiment of the present specification, $\Delta E_{12}$, the lightness ($L^*$), and chroma ($a^*$, $b^*$) of the first light absorption layer and the second light absorption layer may be determined by adjusting physical property values such as materials, thicknesses, structures, extinction coefficients (k), refractive indexes (n), or the like of the light absorption layers.

In the exemplary embodiment of the present specification, the first light absorption layer and the second light absorption layer may be made of the same material or different materials.

In the exemplary embodiment of the present specification, each of the first light absorption layer and the second light absorption layer may independently have a single-layered structure or a multilayer structure comprising one material or two or more materials selected from a group consisting of one material or two or more materials selected from indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag); an oxide thereof; a nitride thereof; an oxynitride thereof; carbon; and a carbon composite body.

In the exemplary embodiment of the present specification, each of the first light absorption layer and the second light absorption layer may independently comprise an alloy, an oxide, an nitride, or an oxynitride of two or more materials selected from indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag).

In the exemplary embodiment of the present specification, each of the first light absorption layer and the second light absorption layer may independently comprise one material or two or more materials selected from a copper oxide, a copper nitride, a copper oxynitride, an aluminum oxide, an aluminum nitride, an aluminum oxynitride, and a molybdenum titanium oxynitride.

In the exemplary embodiment of the present specification, each of the first light absorption layer and the second light absorption layer may independently comprise one material or two or more materials selected from carbon and carbon composite.

In the exemplary embodiment of the present specification, the first light absorption layer may be a single layer.

In the exemplary embodiment of the present specification, the second light absorption layer may be a single layer.

In the exemplary embodiment of the present specification, each of the first light absorption layer and the second light absorption layer may independently comprise silicon (Si) or germanium (Ge). The light absorption layer made of silicon (Si) or germanium (Ge) may have a refractive index (n) of 0 to 8, or 0 to 7 at 400 nm and may have an extinction coefficient (k) of larger than 0 and 4 or less, preferably, 0.01 to 4, 0.01 to 3, or 0.01 to 1.

In the exemplary embodiment of the present specification, each of the first light absorption layer and the second light absorption layer may independently comprise one material or two or more materials selected from a copper oxide, a copper nitride, a copper oxynitride, an aluminum oxide, an aluminum nitride, an aluminum oxynitride, and a molybdenum titanium oxynitride. In this case, the light absorption layer may have a refractive index (n) of 1 to 3, for example, 2 to 2.5 at 400 nm and may have an extinction coefficient (k) of larger than 0 and 4 or less, preferably, 0.01 to 2.5, preferably, 0.2 to 2.5, more preferably, 0.2 to 0.6.

In the exemplary embodiment of the present specification, any one or both of the first light absorption layer and the second light absorption layer may be AlOxNy (x>0, y>0).

In the exemplary embodiment of the present specification, any one or both of the first light absorption layer and the second light absorption layer may be AlOxNy ($0 \leq x \leq 1.5$, $0 \leq y \leq 1$).

In the exemplary embodiment of the present specification, any one or both of the first light absorption layer and the second light absorption layer may be AlOxNy (x>0, y>0) and the number of atoms with respect to a total number of atoms of 100% satisfies the following expression.

$$1 < \frac{(Al) \, at \times 3}{(O) \, at \times 2 + (N) \, at \times 3} < 2$$

In the exemplary embodiment of the present specification, the first light absorption layer and the second light absorption layer may comprise the same material or different materials.

In the exemplary embodiment of the present specification, the first light absorption layer and the second light absorption layer may have single-layered structures or multilayer structures comprising different materials.

In the exemplary embodiment of the present specification, the first light absorption layer and the second light absorption layer may have the same thickness or different thicknesses.

In the exemplary embodiment of the present specification, the first light absorption layer and the second light absorption layer may have the same thickness or different thicknesses, and the thickness may be 1 nm or more and 1000 nm or less, 5 nm or more and 500 nm or less, 30 nm or more and 500 nm or less, or 10 nm or more and 100 nm or less. When the numerical value range is satisfied, the colors imparted by the first light absorption layer and the second light absorption layer may have excellent clarity and high dichroism.

In the exemplary embodiment of the present specification, the first light absorption layer and the second light absorption layer may have different thicknesses.

In the exemplary embodiment of the present specification, a ratio between the thickness of the first light absorption layer and the thickness of the second light absorption layer may be 1:1.1 or more and 1:10 or less, 1:1.1 or more and 1:8 or less, or preferably, 1:1.1 or more and 1:5 or less.

In the exemplary embodiment of the present specification, a difference in thickness for each region between the first light absorption layer and the second light absorption layer is 2 to 200 nm and may be determined depending on a difference in desired colors.

In the exemplary embodiment of the present specification, the first light absorption layer and the second light absorption layer may have the same extinction coefficient (k) or different extinction coefficients (k).

In the exemplary embodiment of the present specification, the first light absorption layer and the second light absorption layer may have the same extinction coefficient (k) or different extinction coefficients (k) at 400 nm, and the extinction coefficient (k) may be larger than 0 and 4 or less, 0.01 to 4, 0.01 to 3.5, 0.01 to 3, or 0.1 to 1. The extinction coefficient (k) is $-(1/4\pi l)\,(dI/dx)$ which is a value made by multiplying, by $l/4p$, a reduction ratio dI/I of intensity of light for unit length (dx), for example, for 1 m of a route in the light absorption layer, and l is a wavelength of light.

In the exemplary embodiment of the present specification, each of the first light absorption layer and the second light absorption layer may have an extinction coefficient (k) of larger than 0 and 4 or less, preferably, 0.01 to 4, 0.01 to 3.5, 0.01 to 3, or 0.1 to 1 in the overall wavelength range of 380 to 780 nm of visible rays. Since the extinction coefficient (k) is within the above-mentioned range in the overall wavelength region of visible rays, the function of the light absorption layer may be performed in the visible ray range.

In the exemplary embodiment of the present specification, the first light absorption layer and the second light absorption layer may have different extinction coefficients (k).

In the exemplary embodiment of the present specification, the first light absorption layer and the second light absorption layer have the same refractive index (n) or different refractive indexes (n), and the refractive index (n) may be 0 to 8, 0 to 7, 0.01 to 3, or 2 to 2.5 at 400 nm. The refractive index (n) may be calculated by means of sin θ1/sin θ2, in which θ1 is an angle of light incident on the surface of the light absorption layer, and θ2 is a refraction angle of light in the light absorption layer.

In the exemplary embodiment of the present specification, the first light absorption layer and the second light absorption layer may have different refractive indexes (n).

In the exemplary embodiment of the present specification, each of the first light absorption layer and the second light absorption layer may have a refractive index (n) of 0 to 8, 0 to 7, 0.01 to 3, or 2 to 2.5 at 380 nm to 780 nm. The refractive index (n) may be calculated by means of sin θ1/sin θ2, in which θ1 is an angle of light incident on the surface of the light absorption layer, and θ2 is a refraction angle of light in the light absorption layer.

Even though the first light absorption layer and the second light absorption layer have the same value of the refractive index (n), there may be a difference of $\Delta E + ab = \sqrt{\{(\Delta L)^2 + (\Delta a)^2 + (\Delta b)^2\}} > 1$ between when the value of the extinction coefficient (k) is 0 and when the value of the extinction coefficient (k) value is 0.01 at 380 to 780 nm. For example, according to a result of a simulation performed by emitting D65 (sunlight spectrum), as a light source, to a layered structure comprising glass/aluminum/aluminum oxide/air layers, ΔE*ab was obtained as shown in the following Table 1 when the value of k of the aluminum oxide is 0 and 0.01. In this case, a thickness h1 of the aluminum layer was 120 nm, and thicknesses h2 of the aluminum oxide layer are disclosed in the following Table 1. The values of k were arbitrarily set to 0 and 0.01 for the simulation, and a value of n of aluminum was used as the value of n.

TABLE 1

| h2 [nm] | k = 0 | | | k = 0.01 | | | |
|---|---|---|---|---|---|---|---|
| | L | A | b | L | A | b | ΔE · ab |
| 40 | 6.63 | 1.75 | −1.25 | 85.18 | 2.09 | 0.03 | 1.96 |
| 60 | 9.83 | −4.02 | −8.30 | 87.86 | −4.06 | −9.01 | 2.10 |
| 80 | 5.60 | −1.87 | −2.58 | 94.44 | −2.05 | −2.86 | 1.20 |

In the exemplary embodiment of the present specification, the light reflection layer may be a metal layer, a metal oxynitride layer, or an inorganic layer. The light reflection layer may have a single-layered structure or a multilayer structure having two or more layers. In the exemplary embodiment of the present specification, the light reflection layer may have a single-layered structure or a multilayer structure comprising one material or two or more materials selected from a group consisting of one material or two or more materials selected from indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag); an oxide thereof; a nitride thereof; an oxynitride thereof; carbon; and a carbon composite. In the exemplary embodiment of the present specification, the light reflection layer may comprise an alloy of two or more materials selected from indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag), an oxide, a nitride, or an oxynitride thereof. For example, the light reflection layer may comprise an alloy of two or more materials selected from the above-mentioned metal materials. More specifically, the light reflection layer may comprise molybdenum, aluminum or copper.

In the exemplary embodiment of the present specification, the light reflection layer is manufactured by using ink comprising carbon or a carbon composite, thereby imparting a reflection layer having high resistance. There are carbon black, CNT, and the like as the carbon or carbon composite. The ink comprising the carbon or carbon composite may comprise the above-mentioned materials, or an oxide, a nitride, or an oxynitride thereof, and for example, may comprise an oxide of one material or two or more materials selected from indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag). After performing printing with the ink comprising the carbon or carbon composite, a process of curing the ink may be additionally performed.

In the exemplary embodiment of the present specification, in the case in which the light reflection layer comprises two or more materials, the light reflection layer may be formed by using the two or more materials through a single process, for example, a vapor deposition or printing method. However, it is possible to use a method of forming a layer with one or more materials first and then forming an additional layer on the formed layer by using one or more materials. For example, the light reflection layer may be formed by forming a layer by vapor-depositing indium or tin, performing printing with ink comprising carbon, and then curing the ink. The ink may further comprise an oxide such as a titanium oxide or a silicon oxide.

In the exemplary embodiment of the present specification, a thickness of the inorganic layers may be, for example, 10 nm to 2 μm. The configuration in which the thickness of the inorganic layers is within the above-mentioned range is advantageous in providing the decorative member having dichroism for imparting different colors depending on the viewing direction and having improved visibility of dichroism. For example, the thickness of the inorganic layer may be 10 nm or more, 50 nm or more, or 100 nm or more, and 1 μm or less, 800 nm or less, 600 nm or less, 400 nm or less, or 300 nm or less. The decorative member may have dichroism for imparting different colors depending on the viewing direction. The visibility of dichroism of the decorative member may be improved by changing a shape of a surface of a pattern layer.

The decorative member according to the exemplary embodiment of the present specification may further comprise a pattern layer provided on at any one or more of a portion between the base and the first light absorption layer; a portion between the first light absorption layer and the light reflection layer; a portion between the light reflection layer and the second light absorption layer; and a surface of the second light absorption layer facing the light reflection layer.

In the exemplary embodiment of the present specification, the pattern layer may be provided between the base and the first light absorption layer.

In the exemplary embodiment of the present specification, the pattern layer may comprise a convex portion shape or a concave portion shape having a cross section having an asymmetric structure.

In the exemplary embodiment of the present specification, the pattern layer comprises a convex portion shape having a cross section having an asymmetric structure.

In the exemplary embodiment of the present specification, the pattern layer comprises a concave portion shape having a cross section having an asymmetric structure.

In the exemplary embodiment of the present specification, the pattern layer comprises a convex portion shape having a cross section having an asymmetric structure, and a concave portion shape having a cross section having an asymmetric structure.

In the present specification, the term "cross section" means a section made by cutting a convex portion or a concave portion in any one direction. For example, the term "cross section" may mean a section made by cutting the convex portion or the concave portion in a direction parallel to the ground surface or a direction perpendicular to the ground surface when a decorative member is placed on the ground surface. On a surface of a convex portion shape or a concave portion shape of a pattern layer of a decorative member according to the exemplary embodiment, at least one of the cross sections formed in the direction perpendicular to the ground surface has an asymmetric structure.

In the present specification, the term "a cross section having an asymmetric structure" means that a figure formed along a rim of a cross section has a structure that does not have line symmetry or point symmetry. Line symmetry refers to a property in which parts of any figure overlap each other when the figure is symmetric about a straight line. Point symmetry means a symmetric property in which when any figure is rotated about a point by 180 degrees, the figure completely overlaps an original figure. Here, a rim of the cross section having the asymmetric structure may have a straight shape, a curved shape, or a combination thereof.

In the present specification, the "convex portion shape" may comprise one or more "unit convex portion shapes", and the "concave portion shape" may comprise one or more "unit concave portion shapes". The unit convex portion shape or the unit concave portion shape means a shape comprising two inclined sides (a first inclined side and a second inclined side) but does not comprise three or more inclined sides. Referring to FIG. 8, a convex portion shape P1c in a circle C1c is a single unit convex portion shape comprising the first inclined side and the second inclined side. However, a convex portion shape included in a circle C2c comprises two unit convex portion shapes P1c and P2c. The first inclined side may be defined as a left inclined side of the convex portion shape or the concave portion shape, and the second inclined side may be defined as a right inclined side of the convex portion shape or the concave portion shape.

As described above, with the convex portion or the concave portion each having a cross section having an asymmetric structure included in the surface of the pattern layer, the decorative member may impart dichroism. Dichroism means that different colors are observed depending on the viewing angle. The color may be expressed as CIE L*a*b*, and the color difference may be defined by using a distance ΔE*ab in an L*a*b* space. Specifically, the color difference is $\Delta E*ab = \sqrt{\{(\Delta L)^2 + (\Delta a)^2 + (\Delta b)^2\}}$, and the observer cannot recognize the color difference within the range of 0<ΔE*ab<1 [Reference: Machine Graphics and Vision 20 (4): 383-411]. Therefore, in the present specification, dichroism may be defined as ΔE*ab>1.

In the exemplary embodiment of the present specification, the decorative member has dichroism of ΔE*ab>1. Specifically, the color difference ΔE*ab, which is the distance in the space of L*a*b* on a color coordinate CIE L*a*b* in the entire decorative member, may exceed 1.

FIG. 9 exemplarily illustrates the decorative member comprising the pattern layer according to the exemplary embodiment of the present specification (the base and the protective layer are not illustrated). The surface of the pattern layer may have a shape in which a second convex portion P2c having a smaller height than the convex portion P1c is disposed between the convex portions P1c. Hereinafter, the convex portion named before the second convex portion may be called a first convex portion.

FIG. 10 exemplarily illustrates the decorative member comprising the pattern layer according to the exemplary embodiment of the present specification. The surface of the pattern layer may have a shape further comprising a concave portion P3c having a width W3 and disposed at a pointed end (pointy portion) of the convex portion P1c and having a smaller height than the convex portion P1c. The decorative member may have an effect that an image color slightly varies depending on the viewing angle.

In the exemplary embodiment of the present specification, the pattern layer may comprise the convex portion shape or the concave portion shape, and the convex portion shape or the concave portion shape may be disposed in an inverse manner.

FIG. 11 exemplarily illustrates the decorative member comprising the pattern layer according to the exemplary embodiment of the present specification. As illustrated in FIG. 11A, the surface of the pattern layer may have a shape in which the multiple convex portions are arranged and inverted by 180 degrees. Specifically, the surface of the pattern layer may comprise a first region C1r in which the second inclined surface has a larger inclination angle than the first inclined surface, and a second region C2r in which the second inclined surface has a larger inclination angle than the first inclined surface. As an example, the convex portion included in the first region may be referred to as the first convex portion P1c, and the convex portion included in the second region may be referred to as a fourth convex portion P4c. The heights, the widths, and the inclination angles of the first convex portion P1c and the fourth convex portion P4c and the angles formed between the first and second inclined surfaces may be equal to those disclosed in respect to the convex portion P1c. As illustrated in FIG. 11B, any one of the first region and the second region may correspond to an image or a logo, and the other region may correspond to a background part. The decorative member may have an effect of slightly changing a color of the image or the logo depending on the viewing angle. In addition, it is possible to impart a decorative effect of changing the color of the image or the logo and the color of the background part depending on the viewing direction.

In the exemplary embodiment of the present specification, each of the first region and the second region may comprise multiple convex portions. The widths of the first region and the second region and the number of convex portions may be appropriately adjusted in consideration of a targeted size of the image or the logo.

In the present specification, inclination angles a2 and a3 of the convex portion P1 may mean angles formed between the inclined surfaces S1 and S2 of the convex portion P1 and the horizontal surface of the pattern layer. In the drawings, unless otherwise specified in the present specification, the first inclined surface may be defined as a left inclined surface of the convex portion, and the second inclined surface may mean a right inclined surface of the convex portion.

In the exemplary embodiment of the present specification, the convex portion P1 of the pattern layer may have a polygonal cross section having a column shape extending in one direction. As an example, the convex portion P1 may have a triangular cross section or a shape further comprising a small concave portion at a triangular pointed end (a pointy portion or a vertex portion).

In the exemplary embodiment of the present specification, the angle a1 formed between the first inclined surface S1 and the second inclined surface S2 may range from 80 degrees to 100 degrees. Specifically, the angle a1 may be 80 degrees or more, 83 degrees or more, 86 degrees or more, or 89 degrees or more and 100 degrees or less, 97 degrees or less, 94 degrees or less, or 91 degrees or less. The angle may mean an angle of a vertex formed between the first inclined surface and the second inclined surface. In a case in which the first inclined surface and the second inclined surface do not form a vertex, the angle may mean an angle of a vertex formed by an imaginary surface extending from the first inclined surface and an imaginary surface extending from the second inclined surface.

In the exemplary embodiment of the present specification, a difference between the inclination angle a2 of the first inclined surface of the convex portion P1 and the inclination angle a3 of the second inclined surface may range from 30 degrees to 70 degrees. The difference between the inclination angle a2 of the first inclined surface and the inclination angle a3 of the second inclined surface may be, for example, 30 degrees or more, 35 degrees or more, 40 degrees or more, or 45 degrees or more and 70 degrees or less, 65 degrees or less, 60 degrees or less, or 55 degrees or less. The configuration in which the difference in inclination angles between the first inclined surface and the second inclined surface is within the above-mentioned ranges may be advantageous in imparting color expressions depending on the direction. That is, it is possible to further improve dichroism.

In the exemplary embodiment of the present specification, a height H1 of the convex portion P1 may be 5 μm to 30 μm. The configuration in which the height of the convex portion is within the above-mentioned range may be advantageous in terms of production processes. In the present specification, the height of the convex portion may mean a shortest distance between a highest portion and a lowest portion of the convex portion based on the horizontal surface of the pattern layer. The description of the numerical value range in respect to the height of the convex portion may be equally applied to a depth of the concave portion.

In the exemplary embodiment of the present specification, a width W1 of the convex portion P1c may be 10 μm to 90

µm. The configuration in which the width of the convex portion is within the above-mentioned range may be advantageous in terms of the process of processing and forming the pattern. For example, the width W1 of the convex portion P1c may be 10 µm or more, 15 µm or more, 20 µm or more, or 25 µm or more, and 90 µm or less, 80 µm or less, 70 µm or less, 60 µm or less, 50 µm or less, 40 µm or less, or 35 µm or less. The description regarding the width may be applied to the concave portion as well as the convex portion.

In the exemplary embodiment of the present specification, an interval between the convex portions P1 may be 0 µm to 20 µm. In the present specification, the interval between the convex portions may mean a shortest distance between the adjacent two convex portions, that is, between a point at which one convex portion terminates and a point at which the other convex portion starts. In a case in which the interval between the convex portions is appropriately maintained, a relatively bright color needs to be imparted when viewing the decorative member from an inclined surface of the convex portion having a larger inclination angle. The appropriately maintained interval between the convex portions may improve the situation in which a reflection region is dark by shading. As described below, a second convex portion having a smaller height than the convex portion may be further provided between the convex portions. The description regarding the interval may be applied to the concave portion as well as the convex portion.

In the exemplary embodiment of the present specification, a height H2 of the second convex portion P2 may range from ⅕ to ¼ of the height H1 of the first convex portion P1. For example, a difference (H1−H2) in height between the first convex portion and the second convex portion may be 10 µm to 30 µm. A width W2 of the second convex portion P2c may be 1 µm to 10 µm. Specifically, the width W2 of the second convex portion P2c may be specifically 1 µm or more, 2 µm or more, 3 µm or more, 4 µm or more, or 4.5 µm or more, and 10 µm or less, 9 µm or less, 8 µm or less, 7 µm or less, 6 µm or less, or 5.5 µm or less.

In the exemplary embodiment of the present specification, the second convex portion P2c may have two inclined surfaces S3 and S4 having different inclination angles. An angle a4 formed between the two inclined surfaces of the second convex portion may be 20 degrees to 100 degrees. Specifically, the angle a4 may be 20 degrees or more, 30 degrees or more, 40 degrees or more, 50 degrees or more, 60 degrees or more, 70 degrees or more, 80 degrees or more, or 85 degrees or more, and 100 degrees or less, or 95 degrees or less. A difference (a6−a5) in inclination angle between the two inclined surfaces of the second convex portion may be 0 degree to 60 degrees. The difference (a6−a5) between the inclination angles may be 0 degree or more, 10 degrees or more, 20 degrees or more, 30 degrees or more, 40 degrees or more, or 45 degrees or more, and 60 degrees or less, or 55 degrees or less. The configuration in which the dimension of the second convex portion is within the above-mentioned range may be advantageous in forming a bright color by increasing the introduction of light at a side having a large inclined surface angle.

In the exemplary embodiment of the present specification, a height H3 of the concave portion P3 may be 3 µm to 15 µm. Specifically, the height H3 of the concave portion P3 may be 3 µm or more, and 15 µm or less, 10 µm or less, or 5 µm or less. The concave portion may have two inclined surfaces S5 and S6 having different inclination angles. An angle a7 formed between the two inclined surfaces of the concave portion may be 20 degrees to 100 degrees. Specifically, the angle a7 may be 20 degrees or more, 30 degrees or more, 40 degrees or more, 50 degrees or more, 60 degrees or more, 70 degrees or more, 80 degrees or more, or 85 degrees or more, and 100 degrees or less, or 95 degrees or less. A difference (a9−a8) in inclination angle between the two inclined surfaces of the concave portion may be 0 degree to 60 degrees. The difference (a9−a8) between the inclination angles may be 0 degree or more, 10 degrees or more, 20 degrees or more, 30 degrees or more, 40 degrees or more, or 45 degrees or more, and 60 degrees or less, or 55 degrees or less. The configuration in which the dimension of the concave portion is within the above-mentioned range may be advantageous in that it is possible to add color sensations on a mirror surface.

In the exemplary embodiment of the present specification, the pattern layer comprises the convex portion shape, the cross section of the convex portion shape comprises the first inclined side and the second inclined side, the first inclined side and the second inclined side are identical to or different from each other in terms of a shape, and each of the first inclined side and the second inclined side has a straight shape or a curved shape.

FIG. 12 exemplarily illustrates the decorative member comprising the pattern layer according to the exemplary embodiment of the present specification. The cross section of the pattern layer has the convex portion shape, and the cross section of the convex portion shape comprises a first region D1 comprising a first inclined side, and a second region D2 comprising a second inclined side. Each of the first inclined side and the second inclined side has a straight shape. An angle c3 formed between the first inclined side and the second inclined side may be 75 degrees to 105 degrees, or 80 degrees to 100 degrees. An angle c1 formed between the first inclined side and the ground surface and an angle c2 formed between the second inclined side and the ground surface are different from each other. For example, a combination of c1 and c2 may be 20 degrees/80 degrees, 10 degrees/70 degrees, or 30 degrees/70 degrees.

FIG. 13 exemplarily illustrates the decorative member comprising the pattern layer according to the exemplary embodiment of the present specification. The cross section of the pattern layer has the convex portion shape, and the cross section of the convex portion shape comprises a first region E1 comprising a first inclined side, and a second region E2 comprising a second inclined side. Any one or both of the first inclined side and the second inclined side may have a curved shape. For example, both of the first inclined side and the second inclined side each have a curved shape. Alternatively, the first inclined side may have a straight shape, and the second inclined side may have a curved shape. In a case in which the first inclined side has a straight shape and the second inclined side has a curved shape, the angle c1 may be larger than the angle c2. FIGS. 13A and 13B are views illustrating the state in which the first inclined side has a straight shape and the second inclined side has a curved shape. An angle formed between the ground surface and the inclined side having a curved shape may be calculated from an angle between the ground surface and a certain straight line formed from a point at which the inclined side and the ground surface are in contact with each other to a point at which the first inclined side and the second inclined side adjoin each other. A degree of sinuosity of the second inclined side having a curved shape may vary depending on a height of the pattern layer, and a curved line may have a radius of curvature. The radius of curvature may be equal to or smaller than 10 times a width (E1+E2) of the convex portion shape. FIG. 13A is a view illustrating a state in which the radius of curvature of the curved line is twice the width of the convex portion shape, and FIG. 13B is a view illustrating a state in which the radius of curvature of the curved line is one time the width of the convex portion shape. A ratio of part E2 having a curvature to the width (E1+E2) of the convex portion may be equal to or smaller than 90%. FIGS. 13A and 13B are views illustrating a state in which the ratio of part E2 having a curvature to the width (E1+E2) of the convex portion is 60%.

In the exemplary embodiment of the present specification, the cross section of the convex portion shape may have a polygonal shape such as a triangular or quadrangular shape.

FIG. 14 exemplarily illustrates the decorative member comprising the pattern layer according to the exemplary embodiment of the present specification. The cross section of the pattern layer has a convex portion shape, and a cross section of the convex portion shape may have a quadrangular shape. The quadrangular shape may be a general quadrangular shape and is not particularly limited as long as inclination angles of respective inclined sides are different from one another. The quadrangular shape may be a shape remaining after partially cutting a triangle. For example, the quadrangular shape may be a trapezoidal shape which is a quadrangular shape having a pair of parallel opposite sides, or a quadrangular shape having no pair of parallel opposite sides. The cross section of the convex portion comprises a first region F1 comprising a first inclined side, a second region F3 comprising a second inclined side, and a third region F2 comprising a third inclined side. The third inclined side may or may not be parallel to the ground surface. For example, when the quadrangular shape is a trapezoidal shape, the third inclined side is parallel to the ground surface. Any one or more of the first to third inclined sides may have a curved shape, and the description of the curved shape is as described above. A length comprising F1+F2+F3 may be defined as a width of the convex portion, and the description about the width is as described above.

In the exemplary embodiment of the present specification, the pattern layer may comprise two or more convex portions, and a flat portion may be further provided at some or all of the portions between the convex portions.

FIGS. 15A and 15B exemplarily illustrate the decorative member comprising the pattern layer according to the exemplary embodiment of the present specification. The flat portion may be provided between the convex portions of the pattern layer. The flat portion means a region in which no convex portion is present. The descriptions of the other constituent elements (D1, D2, c1, c2, c3, the first inclined side, and the second inclined side) are as described above except that the pattern layer further comprises the flat portion. Meanwhile, a length comprising D1+D2+G1 is defined as a pitch of the pattern, and the pitch of the pattern differs from the width of the pattern.

In the exemplary embodiment of the present specification, the surface of the convex or concave portion comprises two or more convex or concave portions. As described above, the surface may have the two or more convex or concave portions, thereby increasing dichroism. In this case, the two or more convex or concave portions may be configured such that identical shape is repeatedly formed but may comprise different shapes.

In the exemplary embodiment of the present specification, at least one cross section of the convex or concave portion having the cross section having the asymmetric structure comprises two or more sides that are different in inclination angles, degrees of sinuosity, or shapes. For example, the convex or concave portion has the asymmetric structure in the case in which among the sides constituting at least one cross section, the two sides are different in inclination angles, degrees of sinuosity, or shapes.

In the exemplary embodiment of the present specification, at least one cross section of the convex or concave portion comprises a first inclined side and a second inclined side which are different in inclination angles.

In the present specification, unless otherwise specified, the "side" may be a straight line, but the present invention is not limited thereto, and the entire or a part of the side may be a curved line. For example, the side may comprise a part of an arc of a circle or ellipse, a wavy structure, or a structure such as a zigzag structure.

In the present specification, in the case in which the side comprises a part of an arc of a circle or ellipse, the circle or ellipse may have a radius of curvature. The radius of curvature may be defined as a radius of an arc when an extremely short section of the curved line is converted into the arc.

In the present specification, unless otherwise specified, the "inclined side" means a side in which an angle with respect to the ground surface is larger than 0 degree and equal to or smaller than 90 degrees when the decorative member is placed on the ground surface. In this case, in the case in which the side is a straight line, an angle formed between the straight line and the ground surface may be measured. In the case in which the side comprises a curved line, it is possible to measure an angle formed between the ground surface and a straight line, which connects, by a shortest distance, a point closest to the ground surface and a point farthest from the ground surface among the sides, when the decorative member is placed on the ground surface.

In the present specification, unless otherwise specified, the inclination angle is an angle formed between the ground surface and the surface or side constituting the pattern layer when the decorative member is placed on the ground surface, and the angle is larger than 0 degree and equal to or smaller than 90 degrees. Alternatively, the inclination angle may mean an angle formed between the ground surface and a line segment (a'-b') formed by connecting a point a' at which the surface or side of the pattern layer adjoins the ground surface and a point b' at which the surface or side of the pattern layer is most distant from the ground surface.

In the present specification, unless otherwise specified, the degree of sinuosity means a degree of change in gradients of tangential lines on continuous points on the side or surface. The degree of sinuosity increases as the change in gradients of the tangential lines on the continuous points on the side or surface increases.

In the exemplary embodiment of the present specification, the angle a1 formed between the first inclined side and the second inclined side may range from 80 degrees to 100 degrees. Specifically, the angle a1 may be 80 degrees or more, 83 degrees or more, 86 degrees or more, or 89 degrees or more and 100 degrees or less, 97 degrees or less, 94 degrees or less, or 91 degrees or less. The angle may mean an angle of a vertex formed between the first inclined side and the second inclined side. In a case in which the first inclined side and the second inclined side do not form a vertex, the angle may mean an angle of a vertex formed by an imaginary line extending from the first inclined side and an imaginary line extending from the second inclined side.

In the exemplary embodiment of the present specification, a difference between the inclination angle a2 of the first inclined side of the convex portion P1 and the inclination angle a3 of the second inclined side may range from 30 degrees to 70 degrees. The difference between the inclination angle a2 of the first inclined side and the inclination angle a3 of the second inclined side may be, for example, 30 degrees or more, 35 degrees or more, 40 degrees or more, or 45 degrees or more and 70 degrees or less, 65 degrees or less, 60 degrees or less, or 55 degrees or less. The configuration in which the difference in inclination angles between the first inclined side and the second inclined side is within the above-mentioned range may be advantageous in imparting color expressions depending on the direction.

FIG. 16 is a view exemplarily illustrating the pattern layer of the decorative member according to the exemplary embodiment of the present specification and a method of manufacturing the pattern layer. A cross section of the pattern layer has a convex portion shape, and a cross section of the convex portion shape may have a shape formed by removing a particular region of an ABO1 triangular shape. A method of determining the particular region to be removed is as follows. The same description may be applied to the inclination angles c1 and c2.

1) Any point P1 on an AO1 line segment is set to divide the AO1 line segment at a ratio of $L_1:L_2$.
2) Any point P2 on a BO1 line segment is set to divide the BO1 line segment at a ratio of m1:m2.
3) Any point O2 on an AB line segment is set to divide the AB line segment at a ratio of n1:n2.
4) Any point P3 on an O1O2 line segment is set to divide the O2O1 line segment at a ratio of o1:o2.

In this case, the ratio of $L_1:L_2$, the ratio of m1:m2, the ratio of n1:n2, and the ratio of o1:o2 may be equal to or different from one another and may be 1:1000 to 1000:1 independently and respectively.

5) A region defined by a P1O1P2P3 polygonal is removed.
6) A shape defined by an ABP2P3P1 polygonal is set to the cross section of the convex portion.

The pattern layer may be modified in various forms by adjusting the ratio of $L_1:L_2$, the ratio of m1:m2, the ratio of n1:n2, and the ratio of o1:o2. For example, a height of the pattern may be increased as L1 and m1 are increased, and a height of the concave portion formed in the convex portion may be decreased as o1 is increased. A position at a lowest point of the concave portion formed in the convex portion may be adjusted to be close to any one of the inclined sides of the convex portion by adjusting the ratio of n1.

FIG. 17 is a view exemplarily illustrating the pattern layer manufactured by the method of manufacturing a pattern layer of the decorative member according to FIG. 16. The cross section may have a trapezoidal shape in the case in which all of the ratio of L1:L2, the ratio of m1:m2, and the ratio of o1:o2 are equal. Heights ha and hb of the trapezoidal shape may vary by adjusting the ratio of L1:L2. For example, FIG. 17A is a view illustrating a pattern layer manufactured when the ratio of L1:L2 is 1:1, and FIG. 17B is a view illustrating a pattern layer manufactured when the ratio of L1:L2 is 2:1.

In the exemplary embodiment of the present specification, the convex portion shape or the concave portion shape of the surface of the pattern layer may be a convex portion having a conical shape protruding outward from the surface of the pattern layer or a concave portion having a conical shape recessed inward from the surface of the pattern layer.

In the exemplary embodiment of the present specification, examples of the cone comprise a circular cone, an elliptical cone, or a polygonal cone. Here, a shape of a bottom surface of the polygonal cone is a triangular shape, a quadrangular shape, or a star shape having five or more protruding points. As an example, in the case in which the surface of the pattern layer has the convex portion having a conical shape when the decorative member is placed on the ground surface, at least one of the cross sections of the convex portion perpendicular to the ground surface may have a triangular shape. As another example, in the case in which the surface of the pattern layer has the concave portion having a conical shape when the decorative member is placed on the ground surface, at least one of the cross sections of the concave portion perpendicular to the ground surface may have an inverted triangular shape.

In the exemplary embodiment of the present specification, the conical convex portion shape or the conical concave portion shape may have at least one cross section having an asymmetric structure. For example, a configuration in which two or less identical shapes are present when the conical convex portion or the conical concave portion are rotated by 360 degrees about the vertex of the cone when viewing the conical convex portion or the conical concave portion from the surface of the convex portion or the concave portion is advantageous in imparting dichroism. FIG. 18 is a view illustrating conical convex portions when viewed from the surface of the convex portions, including cones having symmetric structures, and cones having asymmetric structures.

When the decorative member is placed on the ground surface, the cone having the symmetric structure has a structure in which a cross section (hereinafter, referred to as a horizontal cross section) parallel to the ground surface has a circular shape or a regular polygonal shape having sides having an equal length, and the vertex of the cone is present on a line perpendicular to the cross section at a center of gravity of the horizontal cross section to the ground surface. However, when viewed from the surface of the conical convex portion or the conical concave portion, the cone having the cross section having the asymmetric structure has a structure in which the position of the vertex of the cone is present on a vertical line of a point which is not a center of gravity of the horizontal cross section of the cone, or the horizontal cross section of the cone has a polygonal or elliptical shape having the asymmetric structure. In the case in which the horizontal cross section of the cone has a polygonal shape having an asymmetric structure, the cone may be designed such that at least one of the sides or angles of the polygon may be different from the other sides or angles.

For example, as illustrated in FIG. 19, the position of the vertex of the cone may be changed. Specifically, as illustrated in the first picture in FIG. 19, in the case in which the cone is structured such that the vertex of the cone is positioned on the vertical line of the center of gravity 01 of the horizontal cross section with respect to the ground surface of the cone when viewed from the surface of the conical convex portion shape, it is possible to obtain four identical structures when the cone is rotated by 360 degrees based on the vertex of the cone (4 fold symmetry). However, the symmetric structure is broken by designing the vertex of the cone at a position 02 which is not the center of gravity 01 of the horizontal cross section with respect to the ground surface. Assuming that a length of one side of the horizontal cross section to the ground surface is x, movement distances of the vertex of the cone are a and b, a height of the cone, which is a length of a line vertically connecting from the vertex 01 or 02 of the cone to the horizontal cross section to the ground surface is h, and an angle formed between the horizontal cross section and the lateral surface of the cone is θn, the following cosine values may be obtained with respect to surface 1, surface 2, surface 3, and surface 4 in FIG. 19.

$$\cos(\Theta 1) = \frac{\left(\frac{x}{2}\right)}{sqrt\left(h^2 + \left(\frac{x}{2}\right)^2\right)} \quad \cos(\Theta 3) = \frac{\left(\frac{x}{2} - a\right)}{sqrt\left(h^2 + \left(\frac{x}{2} - a\right)^2\right)}$$

$$\cos(\Theta 2) = \frac{\left(\frac{x}{2}\right)}{sqrt\left(h^2 + \left(\frac{x}{2}\right)^2\right)} \quad \cos(\Theta 4) = \frac{\left(\frac{x}{2} - b\right)}{sqrt\left(h^2 + \left(\frac{x}{2} - b\right)^2\right)}$$

In this case, there is no dichroism because θ1 and θ2 are equal to each other. However, dichroism may be imparted because θ3 and θ4 are different from each other, and |θ3−θ4| means a color difference ΔE*ab between two colors. Here, |θ3−θ4|>0. As described above, how much the symmetric structure is broken, that is, a degree of asymmetry may be quantitatively imparted by using the angle formed between the lateral surface and the horizontal cross section of the cone with respect to the ground surface. A numerical value representing the degree of asymmetry is in proportion to the color difference of dichroism.

FIGS. 20A and 20B are views illustrating a surface having a highest point having a convex portion shape in the form of a line, in which FIG. 20A exemplarily illustrates a pattern having a convex portion having no imparted dichroism, and FIG. 20B exemplarily illustrates a pattern having a convex portion having imparted dichroism. A cross section taken along line X-X' in FIG. 20A has an isosceles triangular or equilateral triangular shape, and a cross section taken along line Y-Y' in FIG. 20B has a triangular shape having sides having different lengths.

In the exemplary embodiment of the present specification, the highest point of the pattern layer has a convex portion shape in the form of a line, or the lowest point of the pattern layer has a surface having a concave portion shape in the form of a line. The line shape may be a straight line shape, a curved line shape, a shape comprising both a curved line and a straight line, or a zigzag shape. These configurations are illustrated in FIGS. 21 to 23. The configuration in which there is only one identical shape when the convex portion or the concave portion is rotated by 360 degrees about the center of gravity of the horizontal cross section of the convex portion or the concave portion with respect to the ground surface when viewing the surface of the convex portion shape having the highest point formed in the form of a line or the concave portion shape having the lowest point formed in the form of a line from the surface of the convex portion or the concave portion is advantageous in imparting dichroism.

In the exemplary embodiment of the present specification, the pattern layer has the surface having the convex portion shape or the concave portion shape having a structure made by cutting a pointed end of a conical shape. FIG. 24 illustrates a photographic image in which an inverted trapezoidal concave portion having an asymmetric cross section perpendicular to the ground surface when the decorative member is placed on the ground surface is imparted. The asymmetric cross section may have a trapezoidal or inverted trapezoidal shape. Even in this case, dichroism may be imparted by the cross section having the asymmetric structure.

In addition to the above-mentioned structure, the surfaces having various convex portion shapes or various concave portion shapes may be implemented, as illustrated in FIG. 25.

In the present specification, unless otherwise specified, the term "surface" may be a flat surface, but the present invention is not limited thereto, and the entire or a part of the surface may be a curved surface. For example, the shape of the cross section perpendicular to the surface may comprise a part of an arc of a circle or ellipse, a wavy structure, or a structure such as a zigzag structure.

In the exemplary embodiment of the present specification, the pattern layer comprises a pattern having a symmetric structure. Examples of the symmetric structure comprise a prism structure, a lenticular lens structure, or the like.

In the exemplary embodiment of the present specification, the decorative member comprises the pattern layer having the convex portion shape or the concave portion shape having the asymmetric cross section on the surface of the light absorption layer facing the light reflection layer; between the light absorption layer and the light reflection layer; or on the surface of the light reflection layer facing the light absorption layer.

In the exemplary embodiment of the present specification, the pattern layer has a flat portion on a surface opposite to a surface on which the convex portion shape or the concave portion shape is formed, and the flat portion may be formed on the base. A plastic base may be used as the base layer. The plastic substrate may be made of, but not limited to, triacetyl cellulose (TAC), cyclo olefin copolymer (COP) such as a norbornene derivative, poly methyl methacrylate (PMMA), polycarbonate (PC), polyethylene (PE), polypropylene (PP), polyvinyl alcohol (PVA), diacetyl cellulose (DAC), polyacrylate (Pac), poly ether sulfone (PES), polyetheretherketon (PEEK), polyphenylsulfone (PPS), polyetherimide (PEI), polyethylenenaphthatlate (PEN), polyethyleneterephtalate (PET), polyimide (PI), polysulfone (PSF), polyarylate (PAR), amorphous fluoride resin, or the like.

In the exemplary embodiment of the present specification, the pattern layer may comprise thermosetting resin or ultraviolet curable resin. Photocurable resin or thermosetting resin may be used as the curable resin. Ultraviolet curable resin may be used as the photocurable resin. For example, silicone resin, silicon resin, furan resin, polyurethane resin, epoxy resin, amino resin, phenol resin, urea resin, polyester resin, melamine resin, or the like may be used as the thermosetting resin, but the present invention is not limited thereto. Representatively, an acrylic polymer, for example, a polyester acrylate polymer, a polystyrene acrylate polymer, an epoxy acrylate polymer, a polyurethane acrylate polymer, a polybutadiene acrylate polymer, a silicon acrylate polymer, an alkyl acrylate polymer, or the like may be used as the ultraviolet curable resin, but the present invention is not limited thereto.

In the exemplary embodiment of the present specification, a colored dye may be further provided inside or on at least one surface of the pattern layer. For example, the configuration in which the colored dye is provided on at least one surface of the pattern layer may mean a case in which the colored dye is provided on the base layer provided at the flat portion of the pattern layer.

In the exemplary embodiment of the present specification, anthraquinone-based dye, phthalocyanine-based dye, thioindigo-based dye, perinone-based dye, isoxindigo-based dye, methane-based dye, monoazo-based dye, 1:2 metal complex-based dye, and the like may be used as the colored dye.

In the exemplary embodiment of the present specification, the dye may be added into the curable resin in the case in which the colored dye is provided in the pattern layer. In a case in which the colored dye is further provided on a lower portion of the pattern layer, the upper or lower portion of the base layer may be coated with the layer comprising the dye.

In the exemplary embodiment of the present specification, the content of the colored dye may be, for example, 0 to 50 wt %. The range of transmittance and haze of the pattern layer and the decorative member may be determined based on the content of the colored dye, the transmittance may be, for example, 20% to 90%, and the haze may be, for example, 1% to 40%.

FIG. 26 exemplarily illustrates the decorative member according to the exemplary embodiment of the present specification. FIG. 26 illustrates a layered structure comprising the base 100, the pattern layer 500, the first light absorption layer 200, the light reflection layer 300, and the second light absorption layer 400. The first light absorption layer 200, the light reflection layer 300, and the second light absorption layer 400 may be sequentially formed on the surface having the convex portion shape of the pattern layer. In this case, a thickness t1 of the second light absorption layer in the region E of the pattern layer comprising the first inclined surface and a thickness t2 of the second light absorption layer in the region F of the pattern layer comprising the second inclined surface may be equal to or different from each other. In the structure of the pattern having inclined surfaces facing each other as illustrated in FIG. 26, the thicknesses of the light absorption layers on the two surfaces of the triangular structure may vary even though the vapor deposition is performed under the same condition. Therefore, it is possible to form the light absorption layer having two or more regions having different thicknesses only by a single process. Therefore, the imparted color varies depending on the thickness of the light absorption layer. In this case, the thickness of the light reflection layer does not affect the change in color when the thickness of the light reflection layer is a predetermined thickness or more.

The decorative member according to the exemplary embodiment of the present specification may further comprise a color film provided on at any one or more of a portion between the base and the first light absorption layer; a portion between the first light absorption layer and the light reflection layer; a portion between the light reflection layer and the second light absorption layer; and a surface of the second light absorption layer facing the light reflection layer.

The color film is not particularly limited as long as the color difference ΔE*ab, which is the distance in the space of L*a*b* on the color coordinate CIE L*a*b* of the inorganic layer exceeds 1 in the case in which the color film is present in comparison with the case in which no color film is provided.

The color may be expressed as CIE L*a*b*, and the color difference may be defined by using the distance ΔE*ab in the L*a*b* space. Specifically, $\Delta E^*ab = \sqrt{\{(\Delta L)^2 + (\Delta a)^2 + (\Delta b)^2\}}$ is satisfied, and an observer cannot recognize the color difference within the range of 0<ΔE*ab<1 [Reference Document: Machine Graphics and Vision 20 4:383-411]. Therefore, in the present specification, the color difference according to the addition of the color film may be defined as ΔE*ab>1.

Since the color film is further provided, it is possible to further increase change of a color to be imparted even though the material and the thickness of the inorganic layer such as the light reflection layer and the light absorption layer are determined. A degree of change in color according to the addition of the color film may be defined as the color difference ΔE*ab which is a difference in L*a*b* between before and after the color film is applied.

FIGS. 27A-27F exemplarily illustrate disposition positions of the color film. (Here, the convex portion shape or the concave portion shape on the surface of the pattern layer 101, the protective layer, and the base are not illustrated.)

FIG. 27A illustrates a structure in which the color film 501 is provided on the surface of the second light absorption layer 401 opposite to the light reflection layer 301, FIG. 27B illustrates a structure in which the color film 501 is provided between the second light absorption layer 401 and the light reflection layer 301, FIG. 27C illustrates a structure in which the color film 501 is provided between the light reflection layer 301 and the first light absorption layer 201, and FIG. 27D illustrates a structure in which the color film 501 is provided between the base 101 and the first light absorption layer 201. FIG. 27E illustrates a structure in which the color film 501 is provided on the surface of the base 101 opposite to the first light absorption layer 201, FIGS. 27F and 27E illustrate structures in which the color film is provided between the base and the first light absorption layer; between the first light absorption layer and the light reflection layer; or between the light reflection layer and the second light absorption layer; and on the surface of the second light absorption layer facing the light reflection layer, but the present invention is not limited thereto, one to four of the color films may be omitted.

According to one exemplary embodiment of the present specification, the disposition positions of the color film in the structure in which the pattern layer 601 is provided between the base 101 and first light absorption layer 201 are exemplarily illustrated in FIGS. 28A-28F (the convex portion shape or the concave portion shape of the surface of the pattern layer 101 is omitted).

In the structures illustrated in FIGS. 27A, 27B, 28A, and 28B, the light reflection layer may reflect the incident light by passing through the color film when the visible light transmittance of the color film exceeds 0%, thereby imparting colors according to the stack of the light absorption layer and the light reflection layer.

In the structures illustrated in FIGS. 27C, 27D, 28C, and 28D, the light transmittance of the color expressed from the color film 501 of the light reflection layer 301 may be 1% or more, preferably 3% or more, and more preferably, 5% or more so as to recognize the change in color difference due to the addition of the color film. The reason is that the transmitted light may be mixed with the color by the color film in the range of the visible light transmittance.

The color film may be provided in a state in which one sheet or two or more homogeneous or heterogeneous sheets are laminated.

The color film may be used in combination with the color expressed from the laminated structure of the light reflection layer and the light absorption layer described above to express a desired color. For example, a color film in which one or two or more of pigments and dyes are dispersed in a matrix resin and exhibit the color may be used. The color film as described above may be formed by coating a color film forming composition directly to a position where the color film may be provided or by using a method for coating the color film forming composition on a separate substrate, or arranging or attaching the color film at the position where the color film may be provided after preparing the color film by using a known molding method such as casting, extrusion, or the like. Wet coating or dry coating may be used as the coating method.

The pigment and the dye capable of being included in the color film may be selected from the pigment and the dye known in the art and capable of achieving a desired color from the material of the final decorative member. One or two or more types of pigment and dye such as red pigment and dye, yellow pigment and dye, purple pigment and dye, blue pigment and dye, pink pigment and dye, or the like may be used as the pigment and the dye. Specifically, dyes such as perinone-based red dye, anthraquinone-based red dye, methine-based yellow dye, anthraquinone-based yellow dye, anthraquinone-based purple dye, phthalocyanine-based blue dye, thioindigo-based pink dye, isoxindigo-based pink dye, or the like may be used solely or in combination. The pigment such as carbon black, copper phthalocyanine (C.I. Pigment Blue 15:3), C.I. Pigment Red 112, or pigment blue, Isoindoline yellow may be used solely or in combination. The commercially available dye or pigment may be used, and for example, materials made by Ciba ORACET, Chokwang Paint Ltd., or the like may be used. The types of dye or pigment and the colors thereof are only examples, and various publicly known types of dye or pigment may be used, thereby imparting more various colors.

The matrix resin included in the color film may be made of, but not particularly limited to, publicly known materials such as materials of transparent films, primer layers, bonding layers, and coating layers. For example, various materials such as acrylic resin, polyethylene terephthalate-based resin, urethane-based resin, linear olefin-based resin, cyclo olefin-based resin, epoxy-based resin, and triacetyl cellulose-based resin may be selected, and a copolymer or a mixture of the above-mentioned materials may also be used.

The thickness of the color film is not particularly limited and as long as a desired color may be imparted, the thickness of the color film may be selected and set by those skilled in the art. For example, the thickness of the color film may be 500 nm to 1 mm.

The decorative member according to the exemplary embodiment of the present specification may further comprise a protective layer provided on at any one or more of a portion between the base and the first light absorption layer; a portion between the first light absorption layer and the light reflection layer; a portion between the light reflection layer and the second light absorption layer; and a surface of the second light absorption layer facing the light reflection layer. That is, the protective layer serves to protect the decorative member by being provided between the respective layers of the decorative member or at the outermost side of the decorative member.

In the present specification, the "protective layer" means a layer capable of protecting other layers of the decorative member, unless otherwise defined. For example, the inorganic layer may be prevented from deteriorating in a moisture or heat resistant environment. Alternatively, scratching of the inorganic layer or the pattern layer due to external factors may be effectively suppressed, so that dichroism of the decorative member may be effectively expressed.

In the exemplary embodiment of the present specification, the protective layer comprises an aluminum oxynitride. Since the protective layer comprises aluminum oxynitride (AlON), a function of the protective layer to be described later may be increased as compared with a case where the protective layer does not comprise aluminum oxynitride (AlON). In addition, when adjusting a ratio of each element of aluminum oxynitride, the protective function may be further improved, which will be described below.

In the exemplary embodiment of the present specification, the decorative member further comprises a protective layer, so that damage to the pattern layer and the inorganic layer is suppressed even when left in a high temperature and high humidity environment, and thus an excellent decorative effect may be maintained even in a poor environment.

In the present specification, the aluminum oxynitride may satisfy a numerical value range of $AlO_xN_y$ ($0 \leq x \leq 1.5$, $0 \leq y \leq 1.0$, $x+y>0.8$), preferably, ($0 \leq x \leq 1.0$, $0.1 \leq y \leq 1.0$, $x+y>0.8$), and more preferably, ($0 \leq x \leq 1.0$, $0.5 \leq y \leq 1.0$, $x+y>0.8$). In the case in which the numerical value range is satisfied, the light transmittance is high, and abrasion and friction resistance at a predetermined level is provided. As a result, it is possible to effectively protect the inorganic layer without greatly changing the imparted colors even though a temperature or humidity is changed. In addition, the decorative member comprising the protective layer is improved in moisture resistance and heat resistance. Ratios of respective elements may be measured by a measurement method such as X-ray photoelectron spectroscopy (XPS). In addition, the ratios between the elements may be obtained by adjusting a gas fraction when vapor depositing the aluminum oxynitride.

In the exemplary embodiment of the present specification, the number of scratches, which are formed when abrasion and friction resistance is evaluated by using and reciprocally moving an abrasion and friction resistance tester on the surface of the protective layer 10 times at 27 rpm with a load of 3 g or less, may be three or less, preferably, two or less. In addition, more preferably, the number of scratches may be 0, that is, no scratch may be formed. Regarding a criterion of the evaluation in respect to the scratch, a crack d2, which is ⅓ or more of an operating length d1 of a crack forming device such as steel wool applied to form a scratch on the surface of the protective layer at the time of testing for abrasion and friction resistance, may be considered as a scratch. For example, when the operating length of the crack forming device applied to the surface of the protective layer is 3 cm, a crack having a length of 1.2 cm is considered as a scratch, and a crack having a length of 0.8 cm, less than ⅓ of the operating length, is not considered as a scratch. The operating length d1 of the crack forming device may be adjusted depending on an overall size of the decorative member.

When the numerical value range is satisfied, it is possible to effectively protect the inorganic layer, thereby preventing the imparted colors and the external appearance from being changed.

The friction resistance evaluation may be performed by mounting steel wool (using a 100% oil free, Briwax product) on a fastness rubbing tester (product name: KPD-301, manufacturer: Kipae E&T), and counting the number of cracks considered as scratches formed by reciprocating moving the tester ten times at 27 rpm with a load of 1 g.

In the exemplary embodiment of the present specification, light transmittance of the protective layer may be 90% or more and 100% or less, and preferably, 95% or more and 100% or less at 550 nm. The measurement method is performed in a transmittance measurement mode by using a spectrophotometer (Solidspec. 3700, Shimazu). In order to exclude the effect of the base, the transmittance of the base is set to 100%, and the light transmittance of the protective layer is measured by being compared with the transmittance of the base. When the numerical value range is satisfied, the protective layer has good transparency and excellent optical characteristics of the decorative member may be maintained.

In the exemplary embodiment of the present specification, a thickness of the protective layer may be 5 nm or more and 30 nm or less, or 10 nm or more and 20 nm or less. The thickness may be obtained by adjusting a process pressure, a flow rate of a reactive gas with respect to a plasma gas, voltage, vapor deposition time, and a temperature which are used for vapor deposition for forming the protective layer. When the numerical value range is satisfied, it is possible to improve a protection effect of the protective layer and to prevent the light transmittance of the protective layer from deteriorating.

In the present specification, the protective layer is a layer that differs from the base or the inorganic layer, and whether the protective layer is present may be ascertained by analyzing an etching process or compositions.

Specifically, a qualitative analysis is performed by performing survey scanning in a direction of the surface and thickness of the protective layer by using X-ray photoelectron spectroscopy (XPS) or electron spectroscopy for chemical analysis (ESPA) (Thermo Fisher Scientific Inc.), and then a quantitative analysis is performed by performing narrow scanning. In this case, qualitative and quantitative analyses are performed by obtaining survey scanning and narrow scanning under the following condition. Peak background uses a smart method.

TABLE 2

| Element | Scanning Section Binding Energy | Step Size |
|---|---|---|
| Narrow (Snapshot) | 20.89 eV | 0.1 eV |
| Survey | −10~1350 eV | 1 eV |

The decorative member and the method of manufacturing a decorative member according to the exemplary embodiment of the present specification may be applied to publicly known objects to which the decorative member needs to be applied. For example, the decorative member and the method of manufacturing a decorative member may be applied to portable electronic devices, electronic products, cosmetic containers, furniture, building materials, and the like without limitation. The method of applying the decorative member according to the exemplary embodiment of the present specification to portable electronic devices, electronic products, cosmetic containers, furniture, building materials, and the like is not particularly limited, and a method publicly known as a method of applying a decorative film in the art may be applied. The decorative member may further comprise an adhesive layer as necessary. In another example, the decorative member may be applied to portable electronic devices or electronic products by direct coating. In this case, a separate adhesive layer for attaching the decorative member to portable electronic devices or electronic products may not be required. In another example, the decorative member may be attached to portable electronic devices or electronic products through the adhesive layer. The adhesive layer may use an optically clear adhesive tape (OCA tape) or adhesive resin. As the OCA tape or the adhesive resin, OCA tapes or adhesive resins known in the art may be applied without limitation. If necessary, a release liner for protecting the adhesive layer may be further provided. In the exemplary embodiment of the present specification, the base may comprise a plastic injection-molded product or a glass base for a cosmetic container. In the exemplary embodiment of the present specification, the plastic injection-molded product may comprise one or more of polypropylene (PP), polystyrene (PS), polyvinyl acetate (PVAc), polyacrylate, polyethylene terephthalate (PET), polyvinyl chloride (PVC), polymethyl methacrylate (PMMA), ethylene-vinyl acetate copolymer (EVA), polycarbonate (PC), polyamide, and styrene-acrylonitrile copolymer.

In the exemplary embodiment of the present specification, the cosmetic container may be, but not limited to, a cosmetic compact name plate.

An exemplary embodiment of the present specification provides a method of manufacturing the above-mentioned decorative member, the method comprising: preparing a base; and sequentially forming a first light absorption layer, a light reflection layer, and a second light absorption layer on the base, in which $\Delta E_{12}$ indicated in the following Equation 1 is 1 or more, $$\Delta E_{12} = \sqrt{(L_1^* - L_2^*)^2 + (a_1^* - a_2^*)^2 + (b_1^* - b_2^*)^2} \quad \text{[Equation 1]}$$

In Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

The method of manufacturing a decorative member according to the exemplary embodiment of the present specification comprises the preparing of the base. The description of the base is as described above.

The method of manufacturing a decorative member according to the exemplary embodiment of the present specification comprises the sequentially forming of the first light absorption layer, the light reflection layer, and the second light absorption layer on the base.

The method of manufacturing a decorative member according to the exemplary embodiment of the present specification comprises forming the first light absorption layer on the base, forming the light reflection layer on the first light absorption layer, and forming the second light absorption layer on the light reflection layer.

In the exemplary embodiment of the present specification, the forming of the first light absorption layer, the forming of the light reflection layer on the first light absorption layer, and the forming of the second light absorption layer on the light reflection layer may be performed by a reactive sputtering method. Reactive sputtering is a method in which energetic ions (e.g., Ar+) apply impact to a target material and a target material released at this time is vapor deposited on the surface having the convex portion shape or the concave portion shape of the pattern layer. In this case, a base pressure may be $1.0 \times 10^{-5}$ Torr or less, $6.0 \times 10^{-6}$ Torr or less, and preferably, $3.0 \times 10^{-6}$ Torr or less.

In the reactive sputtering method according to the exemplary embodiment of the present specification, a fraction of the reactive gas to the plasma gas may be 30% or more and 70% or less, preferably, 40% or more and 70% or less, and more preferably, 50% or more and 70% or less. The fraction of the reactive gas may be calculated by ($Q_{reactive\ gas}/(Q_{plasma\ process\ gas} + Q_{reactive\ gas}) * 100\%$). $Q_{reactive\ gas}$ may mean a flow rate of the reactive gas in the chamber, and $Q_{plasma\ process\ gas}$ may be a flow rate of the plasma process gas in the chamber.

In the exemplary embodiment of the present specification, the driving power of the reactive sputtering method may be 100 W or more and 500 W or less, preferably 150 W or more and 300 W or less.

In the exemplary embodiment of the present specification, the time required to apply the driving power of the reactive sputtering method may be 60 seconds or more and 600 seconds or less, and preferably, 60 seconds or more and 500 seconds or less.

In the exemplary embodiment of the present specification, in the reactive sputtering method, different driving power and different operating time may be applied to form the first light absorption layer and the second light absorption layer.

In the exemplary embodiment of the present specification, the voltage applied in the reactive sputtering method may be in a range of 350 V or more and 500 V. The range of the voltage may be adjusted according to the state of the target, the process pressure, the driving power (process power) or the fraction of the reactive gas.

In the exemplary embodiment of the present specification, a deposition temperature of the reactive sputtering method may be 20° C. or more and 300° C. or less. When deposited at a temperature lower than the above range, there is a problem in that the crystallinity of the thin film growth is deteriorated due to insufficient energy necessary for crystal growth of particles released from the target and arriving at the substrate. At a temperature higher than the above range, there is a problem in that the particles released from the target are evaporated or re-evaporated and thus the thin film growth rate is deteriorated.

The method of manufacturing a decorative member according to the exemplary embodiment of the present specification may comprise forming a pattern layer on at any one or more of a portion between the base and the first light absorption layer; a portion between the first light absorption layer and the light reflection layer; a portion between the light reflection layer and the second light absorption layer; and a surface of the second light absorption layer facing the light reflection layer.

In the exemplary embodiment of the present specification, the forming of the pattern layer is performed by applying curable resin composition between target components of the decorative member, compressing the target components with a mold having a target pattern, and then curing the curable resin composition. For example, the mold may be in the form of a flat plate or roll. For example, a soft mold or a hard mold may be used as the mold.

In the exemplary embodiment of the present specification, the method of manufacturing a decorative member may comprise vapor depositing the first and second inorganic layers on the first and second inclined surfaces of the pattern layer, respectively, which comprise the surfaces having the convex portion shape comprising the first and second inclined surfaces having different inclination angles. In this case, since the inorganic layers are vapor deposited on the two inclined surfaces of the pattern layer, respectively, the thickness and the type of the inorganic layer on each of the inclined surfaces may be adjusted, thereby increasing a spectrum of dichroism. Unless particularly disclosed, the descriptions of the decorative member may be equally applied to the manufacture method.

In the exemplary embodiment of the present specification, the first and second inorganic layers may be formed on the upper portions of the first and second inclined surfaces, respectively, by a sputtering method, an evaporation method, a vapor deposition method, chemical vapor deposition (CVD), wet coating, or the like. In particular, since the sputtering method has straightness, it is possible to maximize a difference in deposition thickness of both inclined surfaces of the convex portion by tilting a position of a target.

In the exemplary embodiment of the present specification, the first inorganic layer 201 may be vapor deposited (S1) by being tilted toward the inclined surface of the first and second inclined surfaces of the pattern layer 10 which has a smaller inclination angle, and then the second inorganic layer 202 may be vapor deposited (S2) by being tilted toward the inclined surface having a larger inclination angle. The order of the processes S1 and S2 may be changed, and this configuration may be advantageous in vapor depositing the inorganic materials having different thicknesses on the two inclined surfaces.

In the exemplary embodiment of the present specification, the first and second inorganic layers may be vapor deposited, with different thicknesses, on the upper portions of the first and second inclined surfaces. The thicknesses of the first and second inorganic layers may be appropriately adjusted in consideration of targeted color viewing characteristics within the range disclosed in the descriptions of the respective decorative members.

In the exemplary embodiment of the present specification, the first and second inorganic layers may be vapor deposited, with different materials, on the upper portions of the first and second inclined surfaces. The materials of the first and second inorganic layers may be appropriately adjusted in consideration of targeted color viewing characteristics from the materials disclosed in the descriptions of the respective decorative members.

Hereinafter, the present application will be described in detail with reference to Examples, but the scope of the present specification is not limited by the following Examples.

EXAMPLES

Comparative Example 1

A pattern layer (FIG. 23) was formed by applying ultraviolet curable resin on a base made of polyethylene terephthalate (PET) and curing the ultraviolet curable resin. Thereafter, nitrogen was added and a first light absorption layer made of silicon (Si) was formed on the pattern layer by a reactive sputtering method. In this case, this process was performed for 100 seconds with power of 150 Watt, and a thickness of the formed first light absorption layer was 10 nm.

Thereafter, a light reflection layer (Al, thickness: 120 nm) was formed on the first light absorption layer by performing the reactive sputtering method for 200 seconds with 150 W, and a second light absorption layer made of silicon (Si) was formed on the light reflection layer by performing the nitrogen reactive sputtering method again. In this case, this process was performed for 100 seconds with power of 150 Watt, and a thickness of the formed second light absorption layer was 10 nm.

That is, the first light absorption layer and the second light absorption layer had the same material (Si) and the same thickness.

The shape of the pattern had a structure in which asymmetric prism structures were repeated. An inclination angle of one side of the pattern was 60°, and an inclination angle of the opposite side was 40°. In this case, a pitch of the pattern was 100 micrometers, and a height of the pattern was 25 micrometers.

Example 1

A decorative member was manufactured by the same method as in Comparative Example 1 except that the reactive sputtering was performed for 200 seconds to form the second light absorption layer and the thickness of the second light absorption layer was 20 nm in Example 1.

Example 2

A decorative member was manufactured by the same method as in Comparative Example 1 except that the reactive sputtering was performed for 250 seconds to form the second light absorption layer and the thickness of the second light absorption layer was changed to 25 nm.

Example 3

A decorative member was manufactured by the same method as in Comparative Example 1 except that the reactive sputtering was performed for 300 seconds to form the second light absorption layer and the thickness of the second light absorption layer was 30 nm.

Evaluation Example 1

Light was incident on the bases of the samples of the decorative members obtained according to Comparative Example 1 and Examples 1 to 3, and the light, which passed through the first light absorption layers and then was reflected by the light reflection layers, could be observed from the bases. In addition, light was incident on the second light absorption layers of the obtained samples, and the light, which passed through the second light absorption layers and was reflected by the light reflection layers, could be observed from the second light absorption layers.

The obtained L*, a*, b*values of the CIE color coordinate are shown in the following Table 3, and the colors are illustrated in FIG. 29. In this case, an angle with respect to the direction perpendicular to the surface of the light absorption layer in a visual field direction was 0°. That is, the direction was a direction perpendicular to the light absorption layer.

In addition, $\Delta E_{12}$ is calculated by means of the following Equation 1 and shown in the following Table 3.

$$\Delta E_{12} = \sqrt{(L_1^* - L_2^*)^2 + (a_1^* - a_2^*)^2 + (b_1^* - b_2^*)^2} \quad \text{[Equation 1]}$$

In Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

TABLE 3

| | First Light Absorption Layer | | | Second Light Absorption Layer | | | |
|---|---|---|---|---|---|---|---|
| | $L_1^*$ | $a_1^*$ | $b_1^*$ | $L_2^*$ | $a_2^*$ | $b_2^*$ | $\Delta E_{12}$ |
| Comparative Example 1 | 47 | 12 | 22 | 47 | 12 | 22 | 0.0 |
| Example 1 | 48 | 13 | 23 | 22 | 4 | 4 | 33.4 |
| Example 2 | 48 | 13 | 23 | 36 | 2 | 7 | 22.8 |
| Example 3 | 48 | 13 | 23 | 28 | 1 | −11 | 41.2 |

From the above-mentioned results, it was ascertained that the calculated value of $\Delta E_{12}$ of the decorative member according to Comparative Example 1 was 0 because the same color is imparted by the first light absorption layer and the second light absorption layer, but the calculated value of $\Delta E_{12}$ of each of the decorative members according to Examples 1 to 3 was 1 or more, such that various colors were imparted at both surfaces of the decorative member.

The invention claimed is:

1. A decorative member comprising:
   a base;
   a pattern layer provided on the base; and
   inorganic layers comprising a first light absorption layer, a light reflection layer, and a second light absorption layer sequentially provided on the pattern layer, thereby defining a first interface between the first light absorption layer and the light reflection layer, and a second interface between the second light absorption layer and the light reflection layer,
   wherein each of the first light absorption layer and the second light absorption layer independently is a single-layered structure comprising one material or two or more materials selected from a group consisting of: indium (In), silicon (Si), tantalum (Ta),
   wherein the pattern layer comprises a convex portion or a concave portion shape having a cross section with an asymmetric structure,
   wherein the pattern layer comprises thermosetting resin or ultraviolet curable resin,
   wherein $\Delta E_{12}$ indicated in the following Equation 1 is 1 or more, and
   wherein in Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer, $$\Delta E_{12} = \sqrt{(L_1^* - L_2^*)^2 + (a_1^* - a_2^*)^2 + (b_1^* - b_2^*)^2} \quad \text{[Equation 1]}$$

wherein a ratio of a thickness of the first light absorption layer and a thickness of the second light absorption layer is 1:1.1 to 1:10.

2. The decorative member of claim 1, wherein ($L_1^*$):($L_2^*$) is 1.1:1 to 5:1.

3. The decorative member of claim 1, wherein $(a_1^*)^2 + (b_1^*)^2 : (a_2^*)^2 + (b_2^*)^2$ is 2:1 to 200:1.

4. The decorative member of claim 1, wherein CIE lightness ($L_1^*$) of the first light absorption layer is 0 or more and 100 or less, and $(a_1^*)^2 + (b_1^*)^2$ is 300 or more and 28,000 or less.

5. The decorative member of claim 1, wherein CIE lightness ($L_2^*$) of the second light absorption layer is 0 or more and 100 or less, and $(a_2^*)^2 + (b_2^*)^2$ is 10 or more and 28,000 or less.

6. The decorative member of claim 1, wherein the light reflection layer has a single-layered structure or a multilayer structure comprising one material or two or more materials selected from a group consisting of: indium (In), titanium (Ti), tin (Sn), silicon (Si), germanium (Ge), aluminum (Al), copper (Cu), nickel (Ni), vanadium (V), tungsten (W), tantalum (Ta), molybdenum (Mo), neodymium (Nb), iron (Fe), chromium (Cr), cobalt (Co), gold (Au), and silver (Ag); an oxide thereof, a nitride thereof, an oxynitride thereof, carbon, and a carbon composite body.

7. The decorative member of claim 1, wherein the thickness of the first light absorption layer and the thickness of the second light absorption layer are each 1 nm or more and 1000 nm or less.

8. The decorative member of claim 1, further comprising:
   a color film provided at any one or more of:
      a portion between the base and the first light absorption layer;
      a portion between the first light absorption layer and the light reflection layer;

a portion between the light reflection layer and the second light absorption layer; and a surface of the second light absorption layer facing the light reflection layer.

9. The decorative member of claim 1, wherein the base comprises a plastic injection-molded product or a glass base for a cosmetic container.

10. The decorative member of claim 9, wherein the plastic injection-molded product comprises one or more of polypropylene (PP), polystyrene (PS), polyvinyl acetate (PVAc), polyacrylate, polyethylene terephthalate (PET), polyvinyl chloride (PVC), polymethyl methacrylate (PMMA), ethylene-vinyl acetate copolymer (EVA), polycarbonate (PC), polyamide, and styrene-acrylonitrile copolymer.

11. A method of manufacturing the decorative member according to claim 1, the method comprising:

preparing the base;

forming the pattern layer on the base; and sequentially forming the first light absorption layer, the light reflection layer, and the second light absorption layer on the pattern layer, wherein the pattern layer comprises a convex portion or a concave portion shape having a cross section with an asymmetric structure, wherein $\Delta E_{12}$ indicated in the following Equation 1 is 1 or more, and $$\Delta E_{12} = \sqrt{(L_1^* - L_2^*)^2 + (a_1^* - a_2^*)^2 + (b_1^* - b_2^*)^2} \quad \text{[Equation 1]}$$

wherein in Equation 1, $L_1^*$, $a_1^*$, and $b_1^*$ are coordinate values of CIE lightness ($L_1^*$) and chromaticity ($a_1^*$, $b_1^*$) of the first light absorption layer, and $L_2^*$, $a_2^*$ and $b_2^*$ are coordinate values of CIE lightness ($L_2^*$) and chromaticity ($a_2^*$, $b_2^*$) of the second light absorption layer.

12. The decorative member of claim 1, wherein at least one cross section of the convex or concave portion of the pattern layer comprises a first inclined side and a second inclined side which are different in inclination angles.

13. The decorative member of claim 1, wherein the pattern layer comprises a shape in which a second convex portion P2 having a smaller height than a convex portion P1 is disposed between the convex portions P1, wherein the convex portion P1 comprises two inclined sides, and the difference between the inclination angle a2 of the first inclined surface of the convex portion P1 and the inclination angle a3 of the second inclined surface is from 30 degrees to 70 degrees.

14. The decorative member of claim 1, wherein the pattern layer comprises a shape in which a second convex portion P2 having a smaller height than a convex portion P1 is disposed between the convex portions P1, and wherein the second convex portion P2 comprise two inclined surfaces having different inclination angles, the angle formed between the two inclined surfaces of the second convex portion is from 0 degrees to 60 degrees.

\* \* \* \* \*